United States Patent
Mundt et al.

(10) Patent No.: US 9,769,926 B2
(45) Date of Patent: Sep. 19, 2017

(54) BREAKOUT VIA SYSTEM

(71) Applicant: Dell Products L.P., Round Rock, TX (US)

(72) Inventors: Kevin Warren Mundt, Austin, TX (US); Sandor Farkas, Round Rock, TX (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 81 days.

(21) Appl. No.: 14/694,759

(22) Filed: Apr. 23, 2015

(65) Prior Publication Data

US 2016/0316562 A1    Oct. 27, 2016

(51) Int. Cl.
*H05K 1/11* (2006.01)
*H05K 1/02* (2006.01)
*G06F 1/20* (2006.01)
*G06F 1/18* (2006.01)

(52) U.S. Cl.
CPC .......... *H05K 1/114* (2013.01); *G06F 1/185* (2013.01); *G06F 1/20* (2013.01); *H05K 1/0222* (2013.01); *H05K 1/0251* (2013.01); *H05K 2201/09609* (2013.01); *H05K 2201/09636* (2013.01)

(58) Field of Classification Search
None
See application file for complete search history.

(56) References Cited

U.S. PATENT DOCUMENTS

| | | | | |
|---|---|---|---|---|
| 5,150,423 A | * | 9/1992 | Hoki | G01N 21/956 382/145 |
| 5,424,492 A | * | 6/1995 | Petty | H05K 1/115 174/250 |
| 5,479,319 A | * | 12/1995 | Werther | H05K 3/3415 174/260 |
| 5,682,297 A | * | 10/1997 | Silva | H05K 1/0295 174/260 |
| 5,751,554 A | * | 5/1998 | Williams | H01L 22/32 174/260 |
| 5,796,170 A | * | 8/1998 | Marcantonio | H01L 23/24 257/691 |
| 5,985,695 A | * | 11/1999 | Freyman | H01L 23/3128 257/668 |
| 6,037,677 A | * | 3/2000 | Gottschall | H01L 23/49838 257/E23.07 |

(Continued)

*Primary Examiner* — Xanthia C Cunningham
(74) *Attorney, Agent, or Firm* — Haynes and Boone, LLP

(57) ABSTRACT

A circuit board includes a board base with a first surface and a second surface that is located opposite the first surface. A plurality of first coupling pads are located on the first surface of the board base. A plurality of second coupling pads are located on the second surface of the board base. The first coupling pads and the second coupling pads define a coupling pad footprint. A breakout via system is included in the board base. The breakout via system includes a plurality of primary signal vias that are located in the board base and outside of the coupling pad footprint, a plurality of first primary signal via connections that extend between the primary signal vias and the plurality of first coupling pads, and a plurality of second primary signal via connections that extend between the primary signal vias and the plurality of second coupling pads.

20 Claims, 17 Drawing Sheets

(56) References Cited

U.S. PATENT DOCUMENTS

| | | | |
|---|---|---|---|
| 6,404,649 B1* | 6/2002 | Drake | H01L 23/642 257/724 |
| 6,448,639 B1* | 9/2002 | Ma | H01L 23/49816 257/690 |
| 6,462,570 B1* | 10/2002 | Price | G01R 31/2818 324/756.02 |
| 6,630,737 B2* | 10/2003 | Zhao | H01L 23/3128 257/698 |
| 6,774,498 B2* | 8/2004 | Hsu | H01L 23/49838 257/692 |
| 7,005,736 B2* | 2/2006 | Osburn | H01L 23/49838 257/697 |
| 7,131,047 B2* | 10/2006 | Welbon | G01R 31/2808 338/307 |
| 7,345,245 B2* | 3/2008 | Govind | H01L 23/49816 174/260 |
| 8,284,564 B2* | 10/2012 | Mizuno | H05K 1/0231 361/776 |
| 2004/0207990 A1* | 10/2004 | Rose | H05K 1/114 361/790 |
| 2005/0202722 A1* | 9/2005 | Regnier | H05K 1/0222 439/607.05 |
| 2006/0033514 A1* | 2/2006 | LaMeres | G01R 1/06716 324/754.07 |
| 2006/0289202 A1* | 12/2006 | Takeuchi | H01L 23/49827 174/262 |
| 2008/0008435 A1* | 1/2008 | Fuller | H05K 1/0292 385/135 |
| 2008/0150122 A1* | 6/2008 | Lee | H05K 1/114 257/698 |
| 2008/0179083 A1* | 7/2008 | Del Rosario | H05K 1/023 174/260 |
| 2009/0133913 A1* | 5/2009 | Kushta | H01L 23/49827 174/260 |
| 2011/0203843 A1* | 8/2011 | Kushta | H05K 1/0219 174/377 |
| 2012/0119853 A1* | 5/2012 | Kushta | H01P 7/04 333/204 |
| 2012/0306597 A1* | 12/2012 | Kushta | H05K 1/0222 333/204 |
| 2013/0056254 A1* | 3/2013 | Biddle | H05K 1/0245 174/263 |
| 2013/0099876 A1* | 4/2013 | Kushta | H01P 1/203 333/134 |
| 2013/0199834 A1* | 8/2013 | De Geest | H05K 1/024 174/266 |
| 2014/0055873 A1* | 2/2014 | Fretts | G02B 7/02 359/809 |
| 2014/0209370 A1* | 7/2014 | Minich | G09B 23/183 174/266 |
| 2014/0209371 A1* | 7/2014 | Minich | H05K 1/116 174/266 |
| 2014/0326495 A1* | 11/2014 | Paniagua | H05K 1/0251 174/266 |
| 2015/0077197 A1* | 3/2015 | Kushita | H01P 1/20345 333/204 |
| 2015/0342051 A1* | 11/2015 | Yu | H05K 1/181 361/679.55 |
| 2015/0359084 A1* | 12/2015 | Kashiwakura | H01P 3/026 333/246 |
| 2016/0095211 A1* | 3/2016 | Goto | H05K 1/0274 398/135 |

* cited by examiner

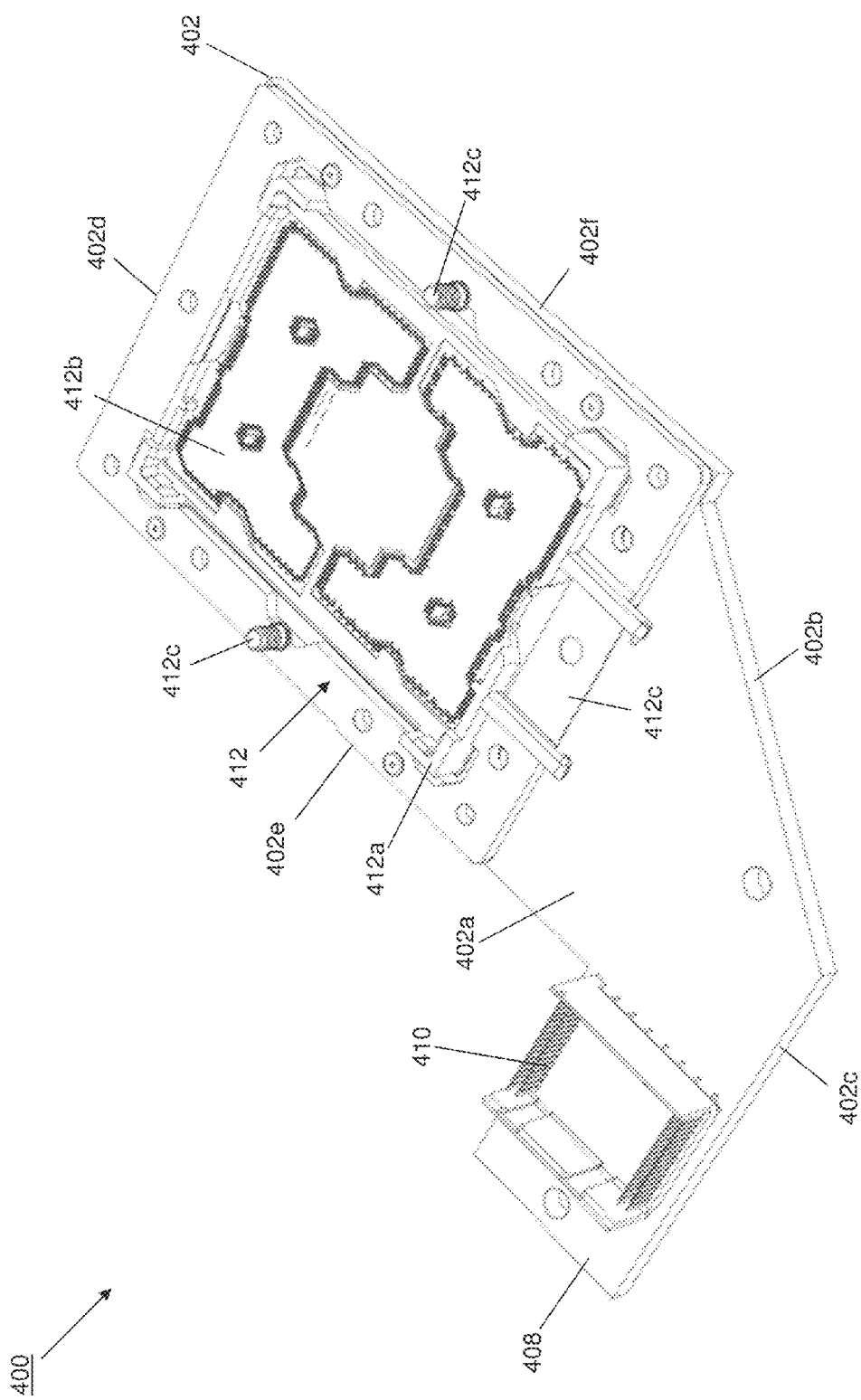

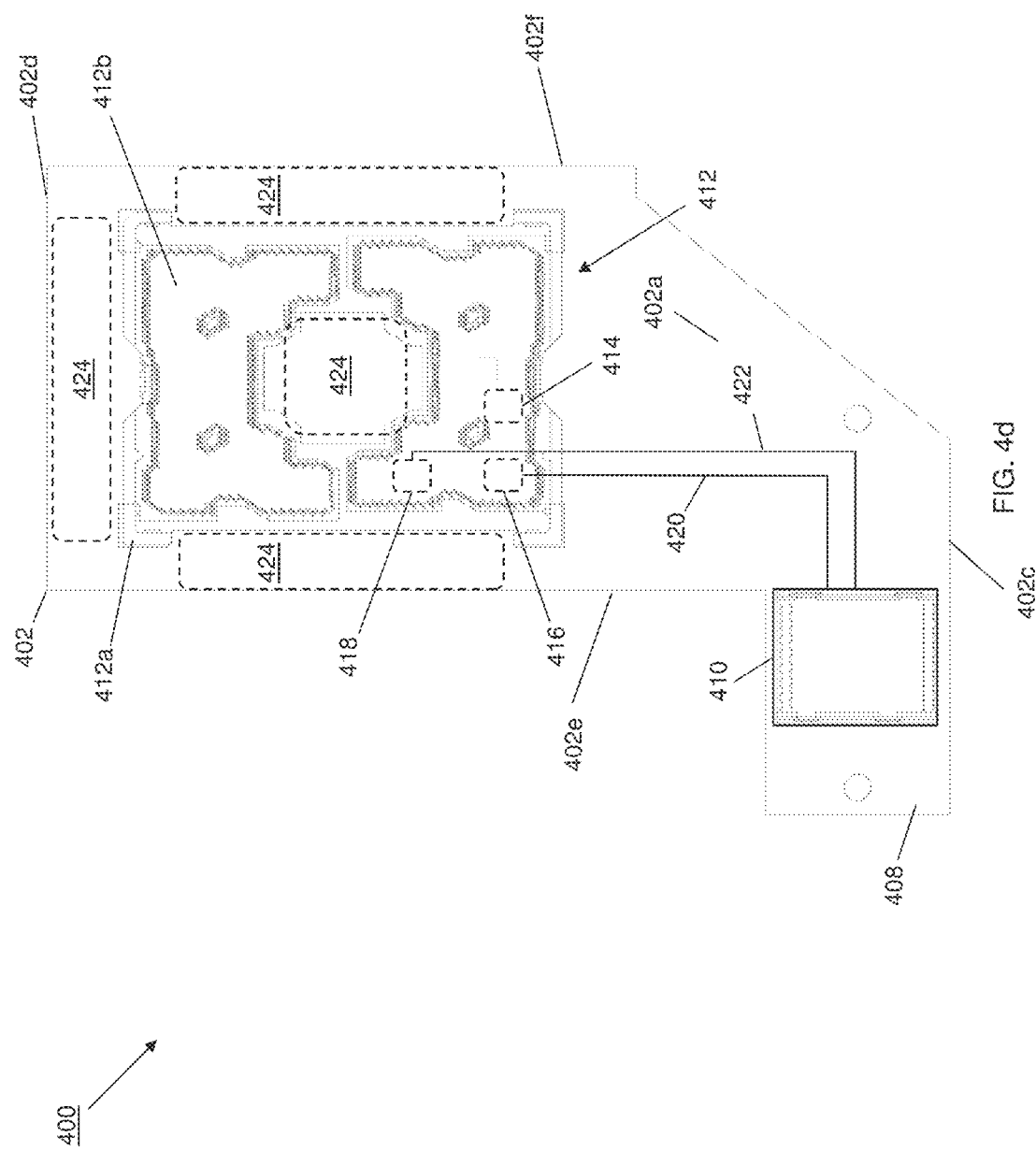

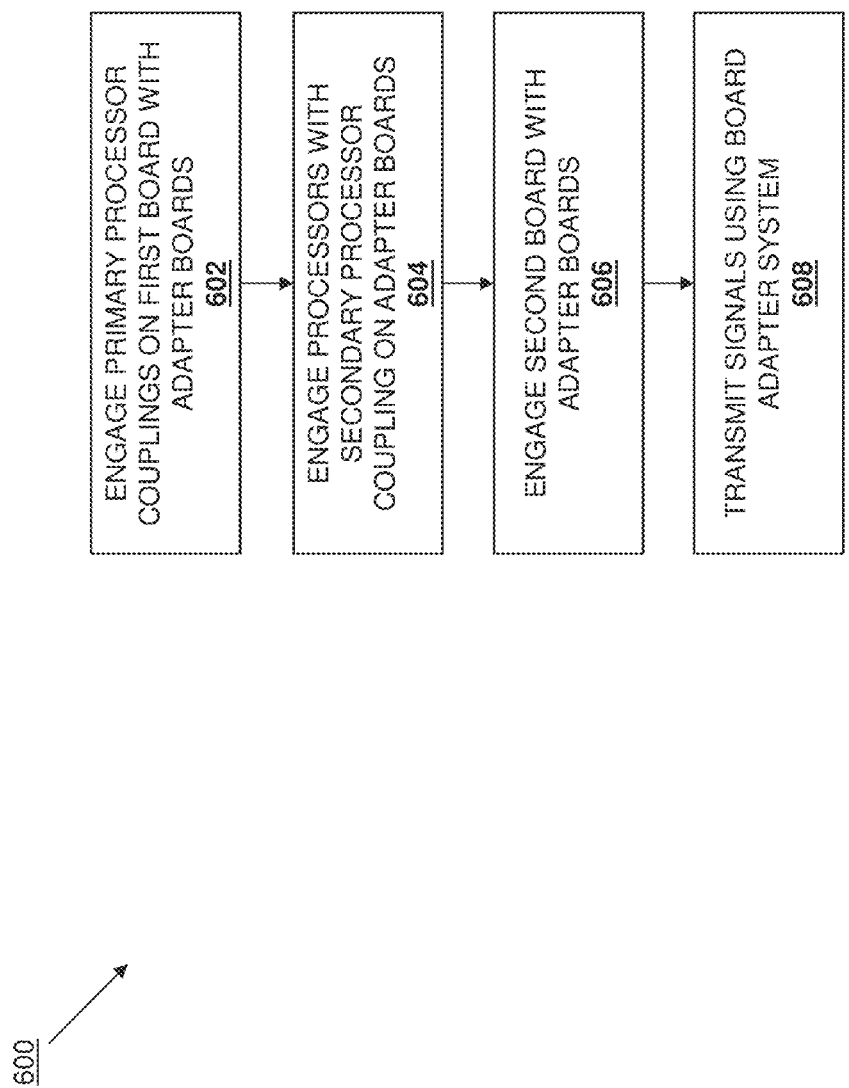

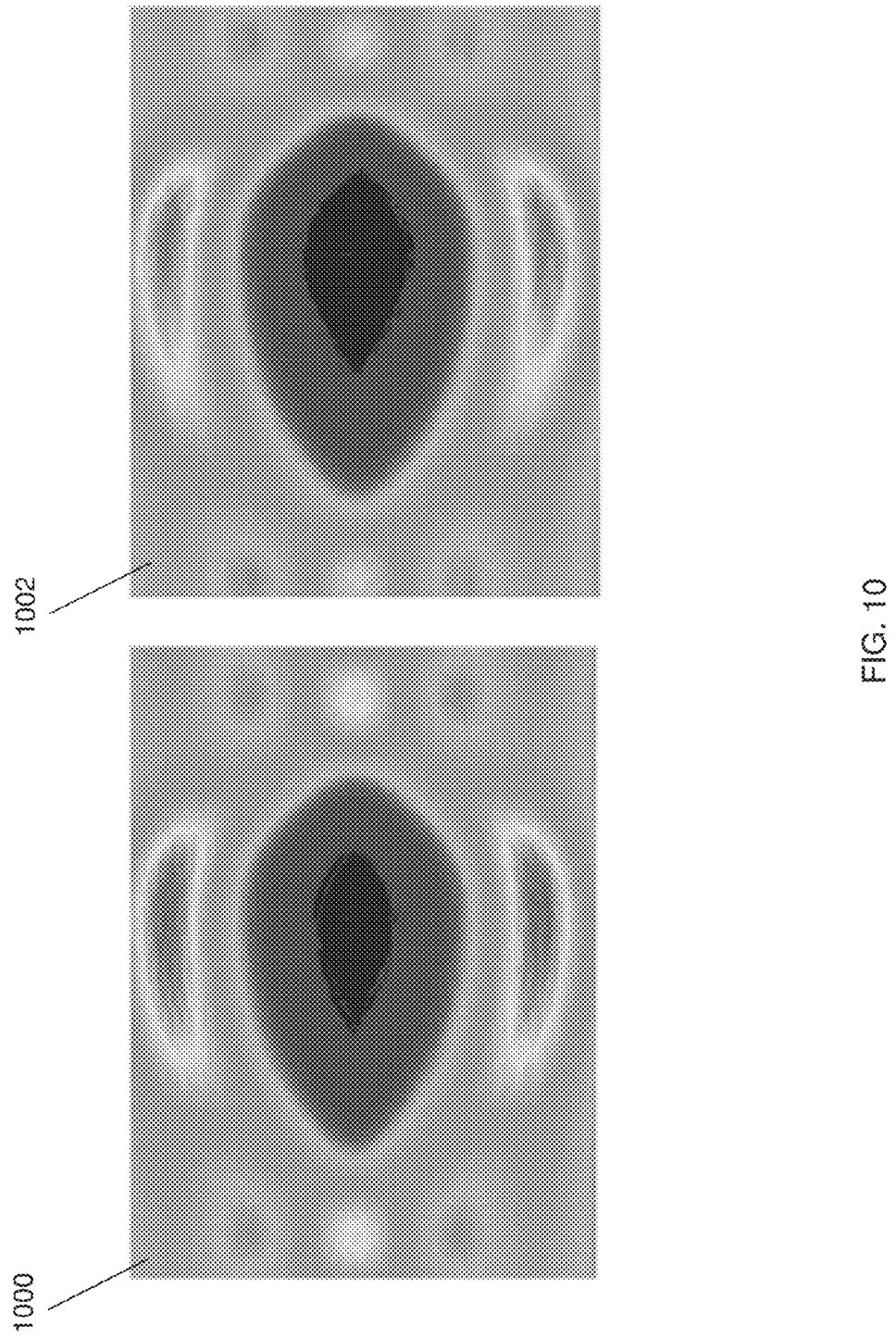

BREAKOUT VIA SYSTEM

BACKGROUND

The present disclosure relates generally to information handling systems, and more particularly to an adapter board system for use with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, servers, may be designed for multiple processors. Furthermore, different types of processors may be designed to operate with a particular or maximum number of other processors. For example, Intel EP-type processors are designed to be used in two-processor servers, while Intel EX-type processors are designed to be used in four-processor servers. Conventionally, EP-type and EX-type processors have included different processor pin definitions and thus have required different processor sockets on the server motherboard. As such, different server motherboards were necessary for systems using the EP-type processors in two-processor servers relative to systems using the EX-type processors in the four-processor servers. However, new EP-type processors and EX-type processors will now have the same processor pin definitions and thus will be able to use the same type of processor socket. It is desirable to be able to leverage a server motherboard that, for example, may be designed to support two processors in a two-processor server, across platforms such that it may be used, for example, in a four-processor server.

Accordingly, it would be desirable to provide systems and methods that enable a motherboard with a first number of processor sockets to be leveraged for use in both a system that uses the first number of processors and a system that uses more than the first number of processors.

SUMMARY

According to one embodiment, an information handling system (IHS) includes a first board including a first surface and a second surface that is located opposite the first board from the first surface; a processor mounted to the first surface of the first board, wherein the mounting of the processor to the first surface defines a processor mounting footprint; a second board engaging the second surface of the first board; and a breakout via system included in the first board, wherein the breakout via system includes a plurality of primary signal vias that are located in the first board and outside of the processor mounting footprint, a plurality of first primary signal via connections that extend from the primary signal vias and that couple to the processor, and a plurality of second primary signal via connections that extend from the primary signal vias and that couple to the second board.

BRIEF DESCRIPTION OF THE DRAWINGS

FIG. 3b is a side perspective view illustrating an embodiment of the second board of FIG. 3a.

FIG. 4b is a perspective view illustrating an embodiment of the adapter board of FIG. 4a.

FIG. 4c is a perspective view illustrating an embodiment of the adapter board of FIGS. 4a and 4b.

FIG. 4d is a top schematic view illustrating an embodiment of the adapter board of FIGS. 4a, 4b, and 4c.

FIG. 5b is a side view illustrating an embodiment of the breakout via system of FIG. 5a.

FIG. 6 is a flow chart illustrating an embodiment of a method for utilizing the first board of FIG. 2 and the second board of FIGS. 3a and 3b using the adapter boards of FIGS. 4a-4d.

FIG. 10 is an experimental results view illustrated the benefits of the breakout system of FIGS. 5a-c.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
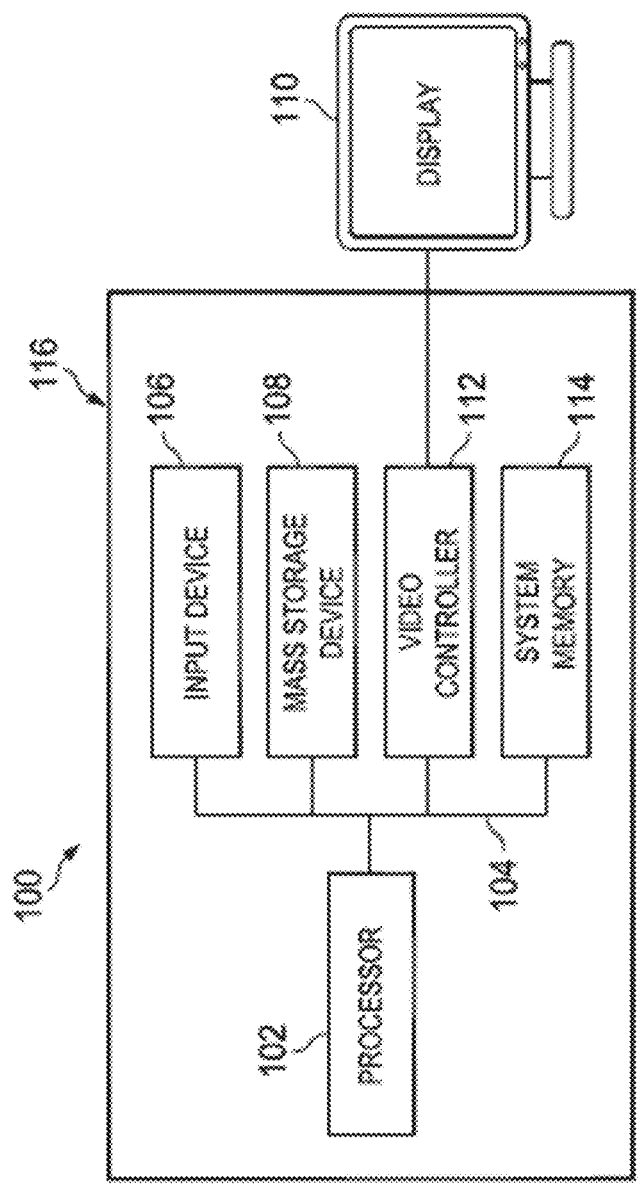
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
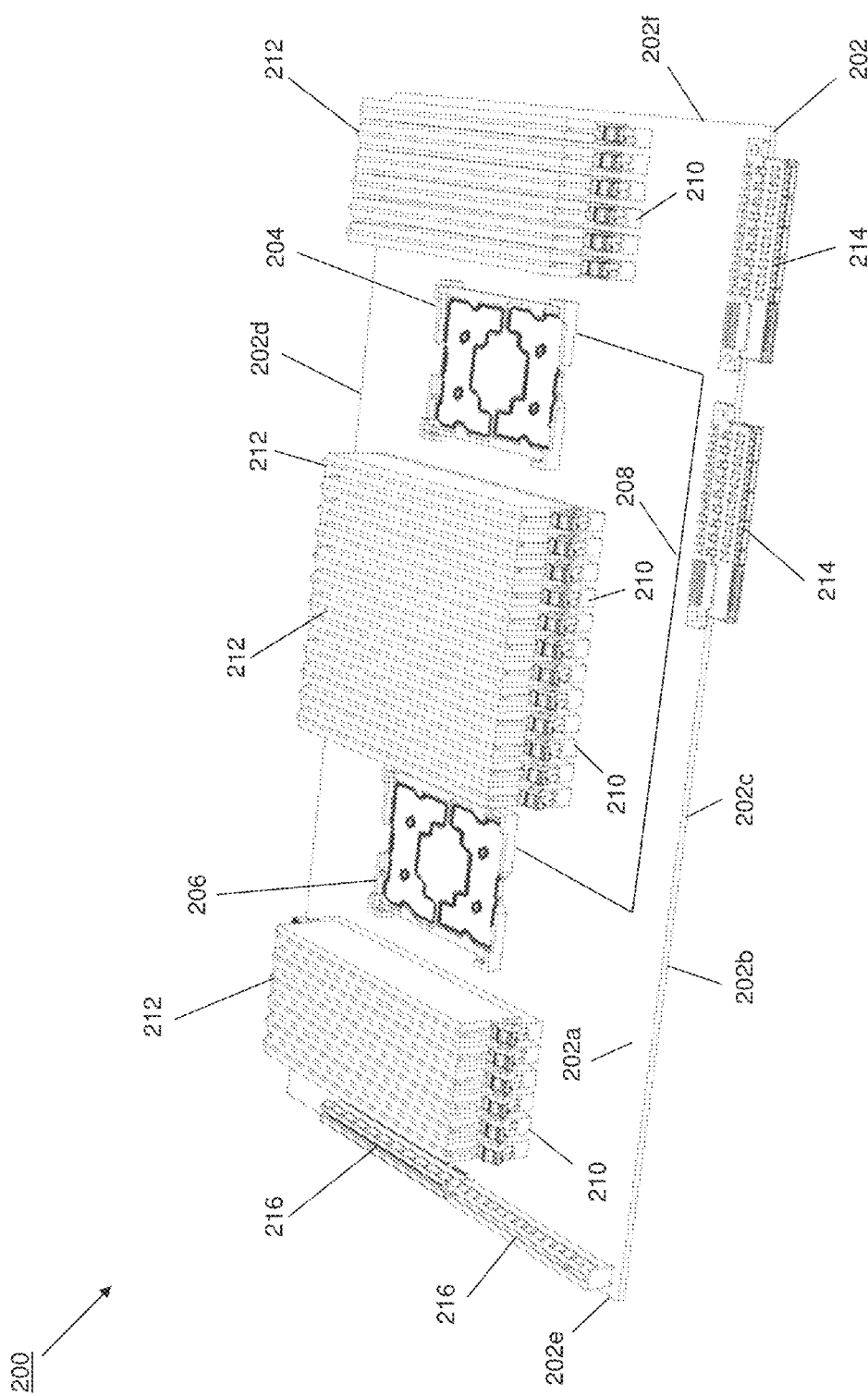
FIG. 2 is a perspective and schematic view illustrating an embodiment of a first board.

Referring now to FIG. 2, an embodiment of a first board 200 is illustrated. The first board 200 includes a board base 202 having a top surface 202a, a bottom surface 202b that is located opposite the board base 202 from the top surface 202a, a front edge 202c extending between the top surface 202a and the bottom surface 202b, a rear edge 202d located opposite the board base 202 from the front edge 202c and extending between the top surface 202a and the bottom surface 202b, and a pair of side edges 202e and 202f that are located opposite the board base 202 from each other and that each extend between the top surface 202a, the bottom surface 202b, the front edge 202c, and the rear edge 202d. A primary first processor coupling 204 is located on the top surface 202a of the board base 202. The primary first processor coupling 204 may include a variety of electrical and mechanical processor coupling features such as, for example, a pin grid array (PGA), alignment features, retention features, and/or other processor coupling features known in the art. A primary second processor coupling 206 is located on the top surface 202a of the board base 202 in a spaced-apart orientation from the primary first processor coupling 204. The primary second processor coupling 206 may include a variety of electrical and mechanical processor coupling features such as, for example, a pin grid array (PGA), alignment features, retention features, and/or other processor coupling features known in the art, as well as heat sink retention features.

In a specific embodiment, the primary first processor coupling 204 and the primary second processor coupling 206 are configured to couple to different variants (e.g., E-type, EP-type, EX-type, etc.) of processors (e.g., processor currently codenamed "Skylake") developed by the Intel Corporation of Santa Clara, Calif. that include a architecture that is to succeed the "Broadwell" processor architecture. However, one of skill in the art in possession of the present disclosure will recognize that other processor couplings will fall within the scope of the present disclosure. A first/second processor communication bus 208 is provided in the board base 202 and extends between the primary first processor coupling 204 (e.g., from one or more pins or connector pads included in the primary first processor coupling 204) and the primary second processor coupling 206 (e.g., from one or more pins or connector pads included in the primary second processor coupling 206). While not illustrated, as discussed below, other processor communication buses, as well as other features, may be provided in the board base 202 but are not explicitly illustrated in FIG. 2 for clarity.

A plurality of memory device connectors 210 are included on the top surface 202a of the board base 202 on either side of both the primary first processor coupling 204 and the primary second processor coupling 206, and a memory device 212 may be coupled to each of the memory device connectors 210, as illustrated. While not illustrated, as discussed below the board base 202 may provide communication buses between the primary first processor coupling 204 (e.g., from one or more pins or connector pads included in the primary first processor coupling 204) and the memory device connectors 210, and between the primary second processor coupling 206 (e.g., from one or more pins or connector pads included in the primary second processor coupling 206) and the memory device connectors 210. A plurality of system connectors 214 are provided adjacent the front edge 202c of the board base 202 and may be configured, for example, to couple to an IHS such as the IHS 100 discussed above with reference to FIG. 1. A plurality of component connectors 216 are provided on adjacent the side edge 202e of the board base 202 and may be configured, for example, to couple to other components known in the art. While a specific first board 200 is illustrated and described herein, one of skill in the art in possession of the present disclosure will recognize that a variety of different boards having a variety of different components and features will fall within the scope of the present disclosure.

Figure 3A:
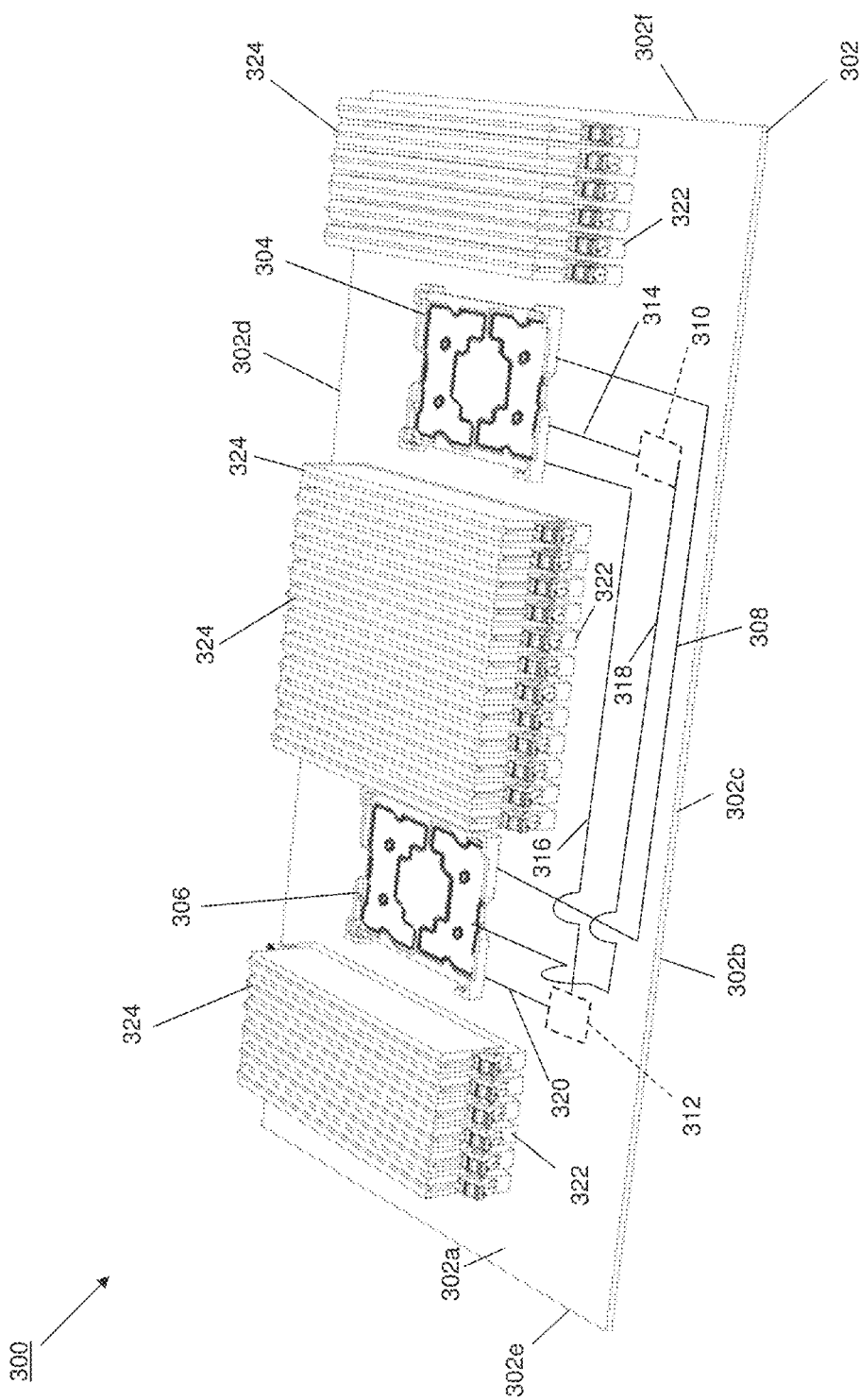
FIG. 3a is a top perspective and schematic view illustrating an embodiment of a second board.
Figure 3B:
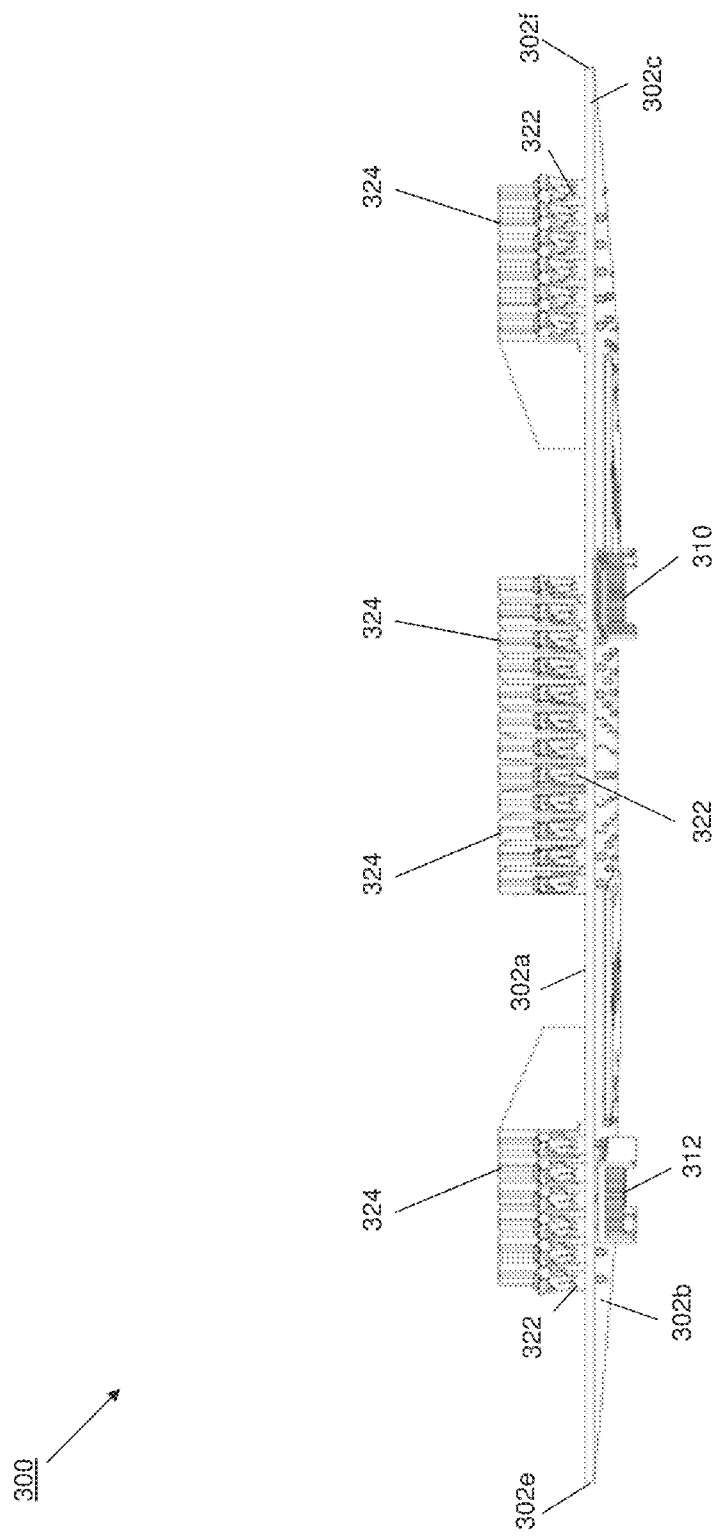

Referring now to FIGS. 3a and 3b, an embodiment of a second board 300 is illustrated. The second board 300 includes a board base 302 having a top surface 302a, a bottom surface 302b that is located opposite the board base 302 from the top surface 302a, a front edge 302c extending between the top surface 302a and the bottom surface 302b, a rear edge 302d located opposite the board base 302 from the front edge 302c and extending between the top surface 302a and the bottom surface 302b, and a pair of side edges 302e and 302f that are located opposite the board base 302 from each other and that each extend between the top surface 302a, the bottom surface 302b, the front edge 302c, and the rear edge 302d. A third processor coupling 304 is located on the top surface 302a of the board base 302. The third processor coupling 304 may include a variety of electrical and mechanical processor coupling features such as, for example, a pin grid array (PGA), alignment features, retention features, and/or other processor coupling features known in the art. A fourth processor coupling 306 is located on the top surface 302a of the board base 302 in a spaced-apart orientation from the third processor coupling 304. The fourth processor coupling 306 may include a variety of electrical and mechanical processor coupling features such as, for example, a pin grid array (PGA), alignment features, retention features, and/or other processor coupling features known in the art. In a specific embodiment, the third processor coupling 304 and the fourth processor coupling 306 are configured to couple to different variants (e.g., E-type, EP-type, EX-type, etc.) of processors (e.g. processors currently codenamed "Skylake") developed by the Intel Corporation of Santa Clara, Calif. that include a architecture that is to succeed the "Broadwell" processor architecture. However, one of skill in the art in possession of the present disclosure will recognize that other processor couplings will fall within the scope of the present disclosure. A third/fourth processor communication bus 308 is provided in the board base 302 and extends between the third processor coupling 304 (e.g., from one or more pins or connector pads included in the third processor coupling 304) and the fourth processor coupling 306 (e.g., from one or more pins or connector pads included in the fourth processor coupling 306).

A first adapter board connector 310 is located on the bottom surface 302b of the board base 302, and a second adapter board connector 312 is located on the bottom surface 302b of the board base 302 in a spaced apart orientation from the first adapter board connector 310. In a specific embodiment, the first adapter board connector 310 and the second adapter board connector 312 may include high speed connectors such as, for example, mezzanine connectors, vertical header/receptacle connectors, and/or a variety of other connectors known in the art. In specific examples, the first adapter board connector 310 and the second adapter board connector 312 may be provided using, at least in part, AirMax® connectors and/or ExaMax® connectors available from FCI Electronics, Impel® connectors available from Molex Electronic Solutions, and/or STRADA Whisper® connectors available from TE Connectivity Ltd. A first/third processor communication bus 314 is provided in the board base 302 and extends between the third processor coupling 304 (e.g., from one or more pins or connector pads included in the third processor coupling 304) and the first adapter board connector 310 (e.g., from one or more pins or connector pads included in the first adapter board connector 310). A second/third processor communication bus 316 is provided in the board base 302 and extends between the third processor coupling 304 (e.g., from one or more pins or connector pads included in the third processor coupling 304) and the second adapter board connector 312 (e.g., from one or more pins or connector pads included in the second adapter board connector 312). A first/fourth processor communication bus 318 is provided in the board base 302 and extends between the fourth processor coupling 306 (e.g., from one or more pins or connector pads included in the fourth processor coupling 306) and the first adapter board connector 310 (e.g., from one or more pins or connector pads included in the first adapter board connector 310). A second/fourth processor communication bus 320 is provided in the board base 302 and extends between the fourth processor coupling 306 (e.g., from one or more pins or connector pads included in the fourth processor coupling 306) and the second adapter board connector 312 (e.g., from one or more pins or connector pads included in the second adapter board connector 312).

A plurality of memory device connectors 322 are included on the top surface 302a of the board base 302 on either side of both the third processor coupling 304 and the fourth processor coupling 306, and a memory device 324 may be coupled to each of the memory device connectors 322, as illustrated. While not illustrated, as discussed below, the board base 302 may provide communication buses between the third processor coupling 304 (e.g., from one or more pins or connector pads included in the third processor coupling 304) and the memory device connectors 322, and between the fourth processor coupling 306 (e.g., from one or more pins or connector pads included in the fourth processor coupling 306) and the memory device connectors 322. While a specific second board 300 is illustrated and described herein, one of skill in the art in possession of the present disclosure will recognize that a variety of different boards having a variety of different components and features will fall within the scope of the present disclosure.

In some embodiments, the first board 200 and the second board 300 may be substantially similar boards, and the first board 200 may be modified to include the connectors 214 and 216, and the second board 300 may be modified to include the first adapter board connector 310 and the second adapter board connector 312. In some embodiments, the first board 200 may include adapter board connectors (not illustrated in FIG. 2) that are similar to the first adapter board connector 310 and the second adapter board connector 312, but that are not utilized in the method 600 discussed below). As such, the first board 200 may include processor communication buses that are similar to the first/third processor communication bus 314, the second/third processor communication bus 316, the first/fourth processor communication bus 318, and the second/fourth processor communication bus 320 in the second board 300 as discussed above with reference to FIGS. 3a and 3b, but those communication buses may not be utilized when the first board 200 is designated as the "first board" to which "first" and "second" processors are to be coupled (discussed in further detail below.) One of skill in the art in possession of the present disclosure will recognize that providing a substantially similar board that may be utilized as either the first board or the second board discussed below provides for manufacturing and cost efficiencies such as, for example, the ability to use one of those board in systems with a two processor configuration and the ability to use two of those boards in systems with a four processor configuration, discussed in further detail below.

Referring now to FIGS. 4a, 4b, 4c, and 4d, and embodiment of an adapter board 400 is illustrated. The adapter board includes a board base 402 having a top surface 402a, a bottom surface 402b that is located opposite the board base 402 from the top surface 402a, a front edge 402c extending between the top surface 402a and the bottom surface 402b, a rear edge 402d located opposite the board base 402 from the front edge 402c and extending between the top surface 402a and the bottom surface 402b, and a pair of side edges 402e and 402f that are located opposite the board base 402 from each other and that each extend between the top surface 402a, the bottom surface 402b, and at least one of the front edge 302c and the rear edge 302d. In an embodiment, the board base 402 may include a high-density board that allows signals to be routed on inner layers of the board base 402. A plurality of processor connector pads 404 are included on the top surface 402a of the board base 402, and at least some of the plurality of processor connector pads 404 may extend through the board base 402 to the bottom surface 402b (e.g., using vias) such that signals provided to those plurality of processor connector pads 404 from the bottom surface 402b of the board base 402 are passed "straight through" the board base 402 to the top surface 402a (e.g., without re-routing or "breaking out" those signals, discussed in further detail below). In some embodiments, a connection feature (not illustrated) may be coupled to the plurality of processor connector pads 404 and located on the bottom surface 402*b* of the board base 402, and the connection feature may be configured to couple to the primary processor couplings 204 and 206 on the first board 200, discussed in further detail below. A plurality of processor coupling system mounting features 406 are defined by the board base 402 and located in a spaced apart orientation around the perimeter of the processor connector pads 404. A board connector support 408 extends from the side edge 402*e* and the front edge 402*c* of the board base 402, and includes a second board connector 410. In a specific embodiment, the second board connector 410 may include high speed connectors such as, for example, mezzanine connectors, vertical header/receptacle connectors, and/or a variety of other connectors known in the art. In specific examples, the second board connector 410 may be provided using, at least in part, AirMax® connectors and/or ExaMax® connectors available from FCI Electronics, Impel® connectors available from Molex Electronic Solutions, and/or STRADA Whisper® connectors available from TE Connectivity Ltd.

Figure 4A:
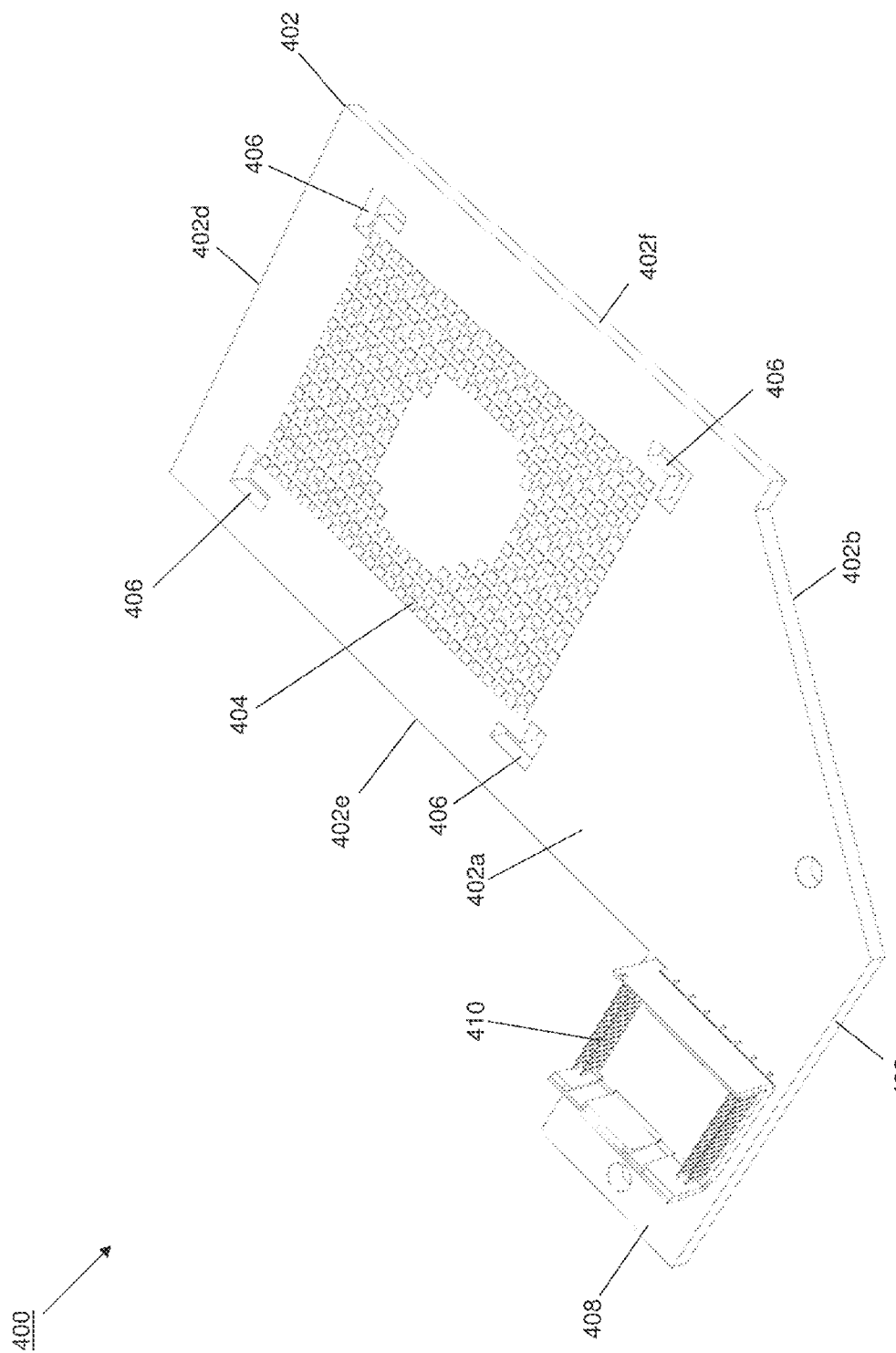
FIG. 4a is a perspective view illustrating an embodiment of an adapter board.
Figure 4B:
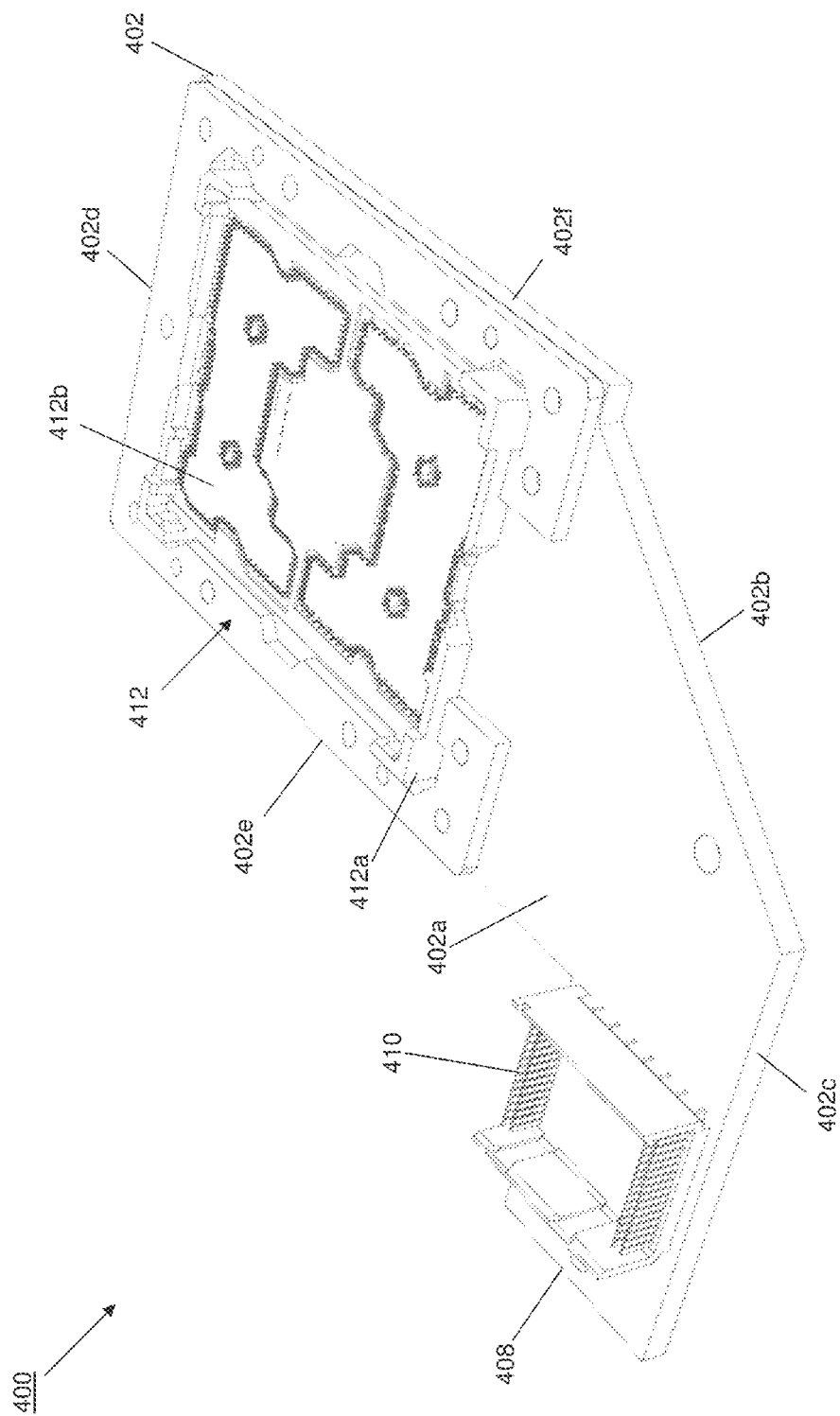

FIGS. 4*b* and 4*c* illustrate a secondary processor coupling 412 that is provided on the adapter board 400 and that may include a processor coupling frame 412*a* that may be mounted to the board base 402 through engagement with the processor coupling system mounting features 406, and a plurality of processor pins 412*b* that engage the plurality of processor connector pads 404. Furthermore, a plurality of heat sink coupling features 412*c* may be coupled to the processor coupling frame 412*a*. FIG. 4*d* illustrates how the plurality of processor pins 412*b* (and the plurality of processor connector pads 404) include a first subset 414 of the plurality of processor pins 412*b* (and processor connector pads 404), a second subset 416 of the plurality of processor pins 412*b* (and processor connector pads 404), and a third subset 418 of the plurality of processor pins 412*b* (and processor connector pads 404). As discussed in further detail below, the board base 402 and the first subset 414 of the plurality of processor pins 412*b* are configured to pass signals between a processor that is coupled to the secondary processor coupling 412 and the processor connector pads 404 on the bottom surface 402*b* of the board base 402 (e.g., using vias that extend directly through the board base 402 rather than using the breakout via systems discussed below). For example, memory lanes, Peripheral Component Interconnect express (PCIe) lanes, a subset of KTI bus lanes, processor input-output lanes, and power lanes may be coupled to the first subset 414 of the plurality of processor pins 412*b* (and processor connector pads 404) to pass associated signals through the board base 402, while the second subset 416 and third subset 418 of the plurality of processor pins 412*b* (and their associated processor connector pads 404) may allow subsets of the KTI bus lanes (e.g., as provided in a Intel EX-type processor such as those codenamed "Skylake", discussed above) to be connected to the third processor coupling 304 and the fourth processor coupling 306, respectively, on the second board 300, discussed below.

As illustrated in FIG. 4*d*, a processor communication bus 420 is provided in the board base 402 and extends between the second subset 416 of the plurality of processor pins 412*b* (e.g., from one or more processor connector pads 404) and the second board connector 410 (e.g., from one or more pins or connector pads included in the second board connector 410), and a processor communication bus 422 is provided in the board base 402 and extends between the third subset 418 of the plurality of processor pins 412*b* (e.g., from one or more processor connector pads 404) and the second board connector 410 (e.g., from one or more pins or connector pads included in the second board connector 410). As discussed below, a plurality of the adapter boards 400 may be used in the method 600. In such situations, a first of the adapter boards 400 may be used as a first adapter board (400*a*) that is coupled to the primary first processor coupling 204 on the first board 200, and that first adapter board 400*a* will include a secondary first processor coupling (412), a first/third processor communication bus (420), and a first/fourth processor communication bus (422); and a second of the adapter boards 400 may be used as a second adapter board (400*b*) that is coupled to the primary second processor coupling 204 on the first board 200, and will include a secondary second processor coupling (412), a second/third processor communication bus (420), and a second/fourth processor communication bus (422).

FIG. 4*d* also illustrates how the board base 402 may include a plurality of breakout via areas 424 that provide a breakout via system. FIG. 4*d* illustrates how the board base 402 provides a perimeter around the secondary processor coupling 412 that provides some of the breakout via areas 424, and how the plurality of processor pins 412*b* and processor connector pads 404 included in the secondary processor coupling 412 provide a breakout via area 424 that is centrally located with respect to the secondary processor coupling 412. As such, the breakout via areas 424 are provided outside a footprint of the secondary processor coupling 412. In other words, the plurality of processor pins 412*b* and processor connector pads 404 occupy an area of the board base 402 that, looking down from the top view of the adapter board 400 that is illustrated in FIG. 4*d*, may be considered a "footprint" of the secondary processor coupling 412, and the breakout via areas 424 are provided outside of that footprint on the board base 402 by not being provided on the board base 402 in the same areas as the processor pins 412*b* and processor connector pads 404 (e.g., located outside the perimeter of the processor pins 412*b* and processor connector pads 404, and located in a central area between the processor pins 412*b* and the processor connector pads 404). In the embodiments illustrated and discussed below, the breakout via system is described as a memory breakout via system. However, the teachings of the breakout via system provided herein may be utilized in any high speed signaling scenario and/or any system utilizing high speed signals known in the art. For example, the single ended traces (e.g., memory traces) discussed below, differential traces (e.g., Peripheral Component Interconnect express (PCI-e) traces, Serial Attached Small Computer System Interface (SAS) traces, etc.) known in the art, and/or other high speed signaling traces may suffer from the complications (e.g., bad signal-to-ground ratio) discussed below when routed directly through a board (e.g., the adapter board described herein, vertical stacker boards used for "sandwiching" multiple boards, etc.), and thus the breakout via systems described herein may be utilized in such systems to meeting signal integrity requirements and provide other benefits similar to those discussed below.

Communications between processors and memory devices are typically performed over high speed communication buses, and experimental embodiments (e.g., signal integrity simulations discussed below) have found that, with the adapter board 400 coupled to a board (e.g., the first board 400*a* below) and a processor coupled to the secondary processor coupling 412 on the adapter board 400, passing those memory device communication signals straight through the board base 402 (e.g., using vias that extend straight through the board base 402 between processor connector pads 404 on the top surface 402a and the bottom surface 402b of the board base 402) will not meet memory communication speed requirements and/or other memory communication signal integrity requirements, as doing so can introduce crosstalk due to, for example, poor signal-to-ground ratios. However, it has been found that memory communication signal integrity requirements can be met with the breakout via system 500 discussed below.

Figure 5A:
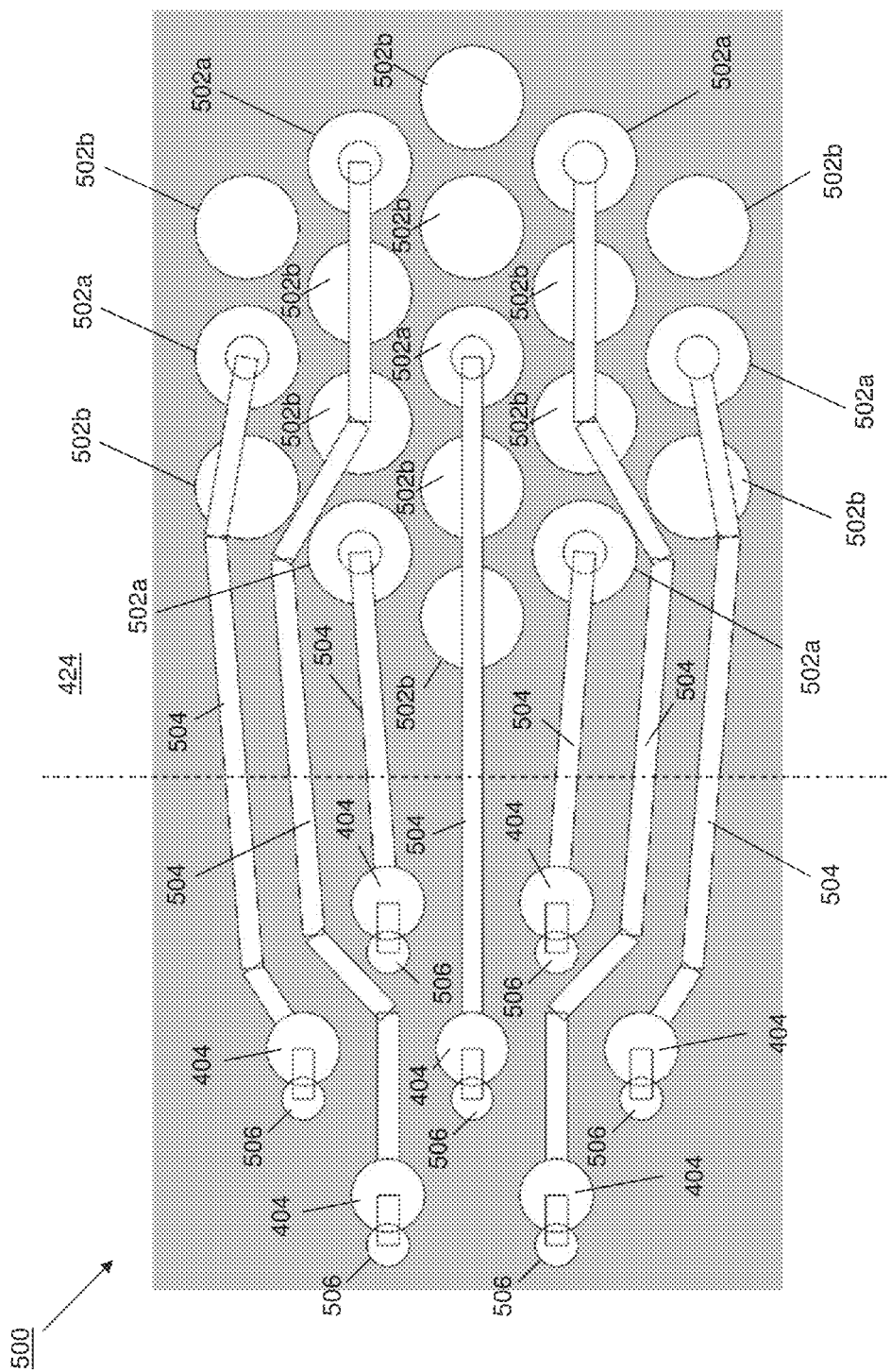
FIG. 5a is a top view illustrating an embodiment of a breakout via system.
Figure 5B:
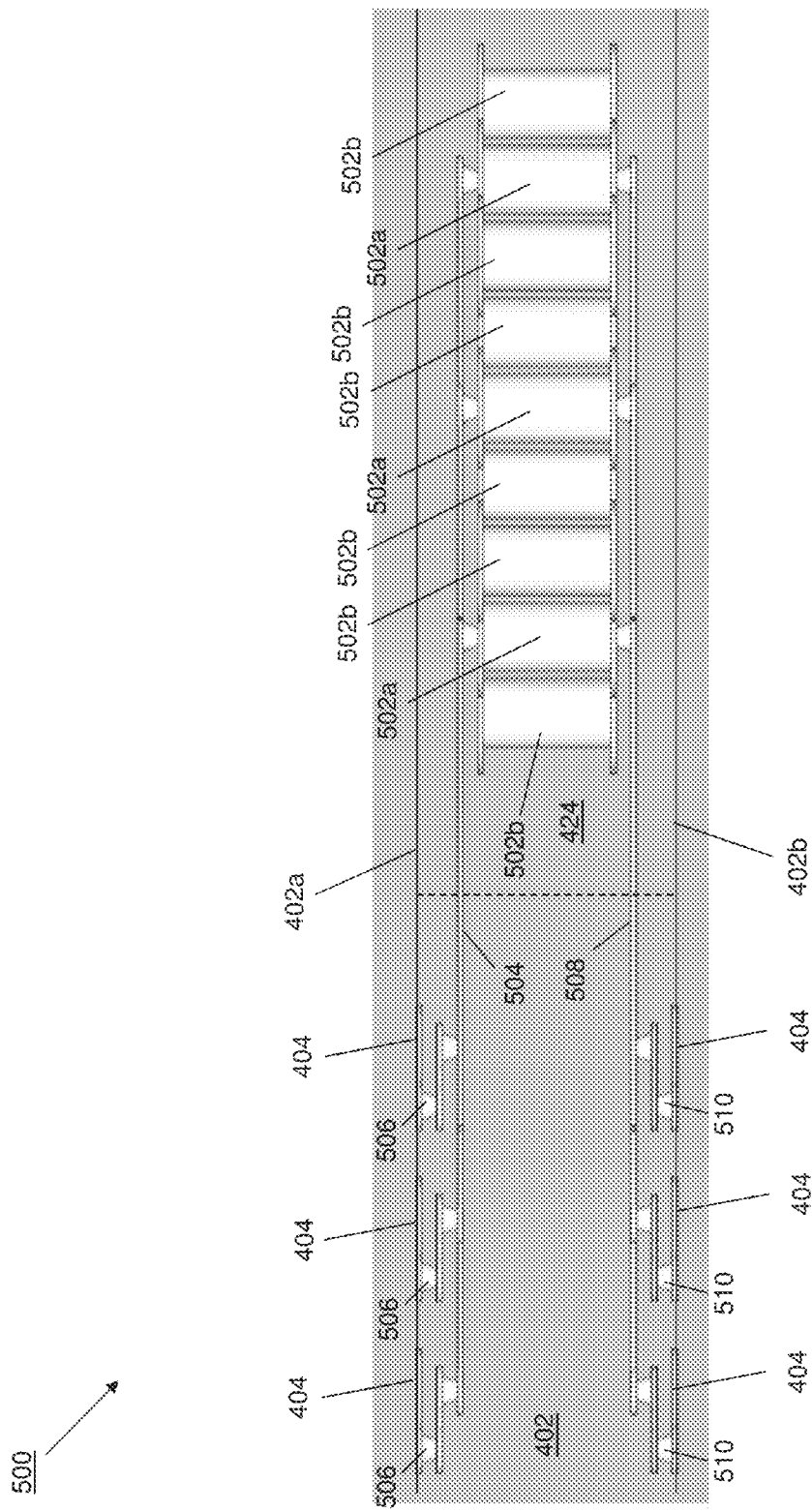
Figure 5C:
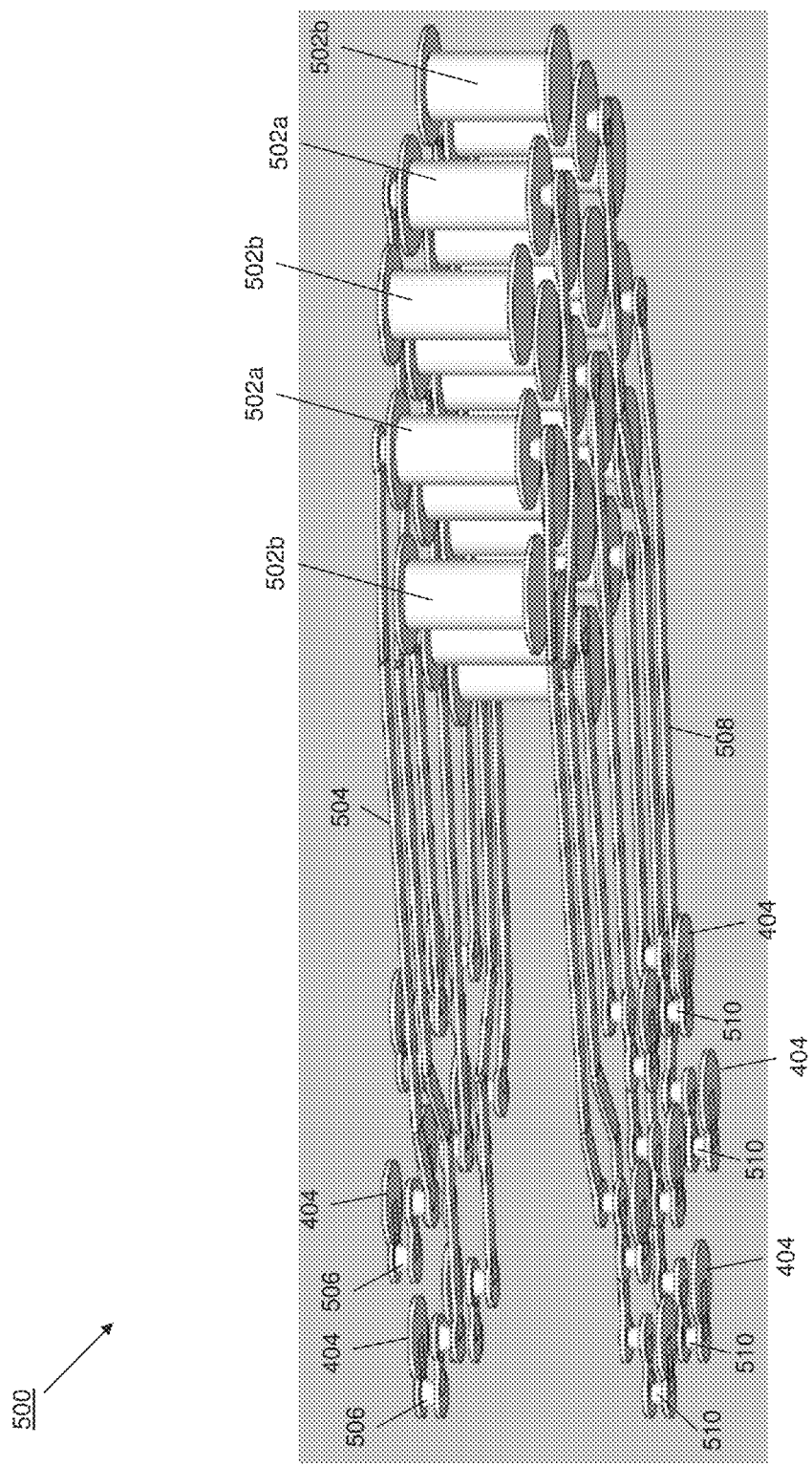
FIG. 5c is a perspective view illustrating an embodiment of the breakout via system of FIGS. 5a, 5b, and 5c.

Referring now to FIGS. 5a, 5b, and 5c, an embodiment of a breakout via system 500 is illustrated. In the illustrated embodiment, the breakout via system 500 includes a plurality of primary signal vias 502a and a plurality of primary ground vias 502b. In FIGS. 5a, 5b, and 5c, ground layers have been omitted for clarity. FIGS. 5a and 5b illustrate how the primary signal vias 502a and the primary ground vias 502b are provided in the breakout via area(s) 424 included on the board base 402 and thus, outside of a footprint of the processor pins 412b and the processor connector pads 404, as discussed above. As illustrated, a plurality of first connections 504 extend through the board base 402 from the primary signal vias 502a (and the breakout via area 424 on the board base 402) to respective secondary vias 506 that are smaller than the primary signal vias 502a and that are located adjacent the top surface 402a of the board base 402 and coupled to the secondary processor coupling 412, and a plurality of second connections 508 extend through the board base 402 from the primary signal vias 502a (and the breakout via area 424 on the board base 402) to respective secondary vias 510 that are smaller than the primary signal vias 502a and that are located adjacent the bottom surface 402b of the board base 402 and coupled to the secondary processor coupling 412. In a specific example, the primary signal vias 502a (and the primary ground vias 502b) may be approximately 154 mm in depth (i.e., as measured through the thickness of the board base 402 between the top surface 402a and the bottom surface 402b), while the secondary vias 506 and 510 may be micro vias that are approximately 3 mm in depth. However, a variety of other sized vias will fall within the scope of the present disclosure. Each of the secondary vias 506 are coupled to one of the processor connector pads 404 that is accessible on the top surface 402a of the board base 402, and each of the secondary vias 510 are coupled to one of the processor connector pads 404 that is accessible on the bottom surface 402b of the board base 402. Connections similar to the plurality of first connections 504 and the plurality of second connections 508 may be provided between the primary of primary ground vias 502b and the processor connector pads 404. In different embodiments, the patterns of the first connections 504 and the second connections 508 may be length matched and/or otherwise optimized for differential pair signals transmitted over subsets of the first connections 504 and the second connections 508.

Referring now to FIG. 6, an embodiment of a method 600 for utilizing a plurality of boards is illustrated. As discussed above, in some embodiments a substantially similar board may be utilized as either the first board 200 or the second board 300. As such, the first board 200 may be used by itself in systems with a two processor configuration (i.e., by coupling a first processor directly to the primary first processor coupling 204 and a second processor directly to the primary second processor coupling 206). However, when a system calls for a four processor configuration, a first adapter board 400 and a second adapter board 400 may be coupled to the first board 200, the second board 300 may be coupled to the first adapter board 400 and the second adapter board 400, a first processor may be coupled to the primary first processor coupling 204 on the first board 200 through the secondary first processor coupling 412 on the first adapter board 400, a second processor may be coupled to the primary second processor coupling 204 on the first board 200 through the secondary second processor coupling 412 on the second adapter board 400, a third processor may be coupled directly to the third processor coupling 304 on the second board 300, and a fourth processor may be coupled directly to the fourth processor coupling 306 on the second board 300.

The method 600 begins at block 602 where primary processor couplings on a first board are engaged with adapter boards. Referring now to FIGS. 2, 4a-4d, and 7, in an embodiment of block 602, one of the adapter boards 400 (hereinafter the "first adapter board 400a") is positioned adjacent the primary first processor coupling 204 on the first board 200 such that the bottom surface 402b of the board base 402 faces the top surface 202a of the first board 200 and the processor connector pads 404 (or coupling feature on the bottom surface 402b of the board base 402) on the first adapter board 400a are aligned with the primary first processor coupling 204. Similarly, one of the adapter boards 400 (hereinafter the "second adapter board 400b") is positioned adjacent the primary second processor coupling 206 on the first board 200 such that the bottom surface 402b of the board base 402 faces the top surface 202a of the first board 200 and the processor connector pads 404 (or coupling feature on the bottom surface 402b of the board base 402) on the second adapter board 400b are aligned with the primary second processor coupling 206.

Figure 7:
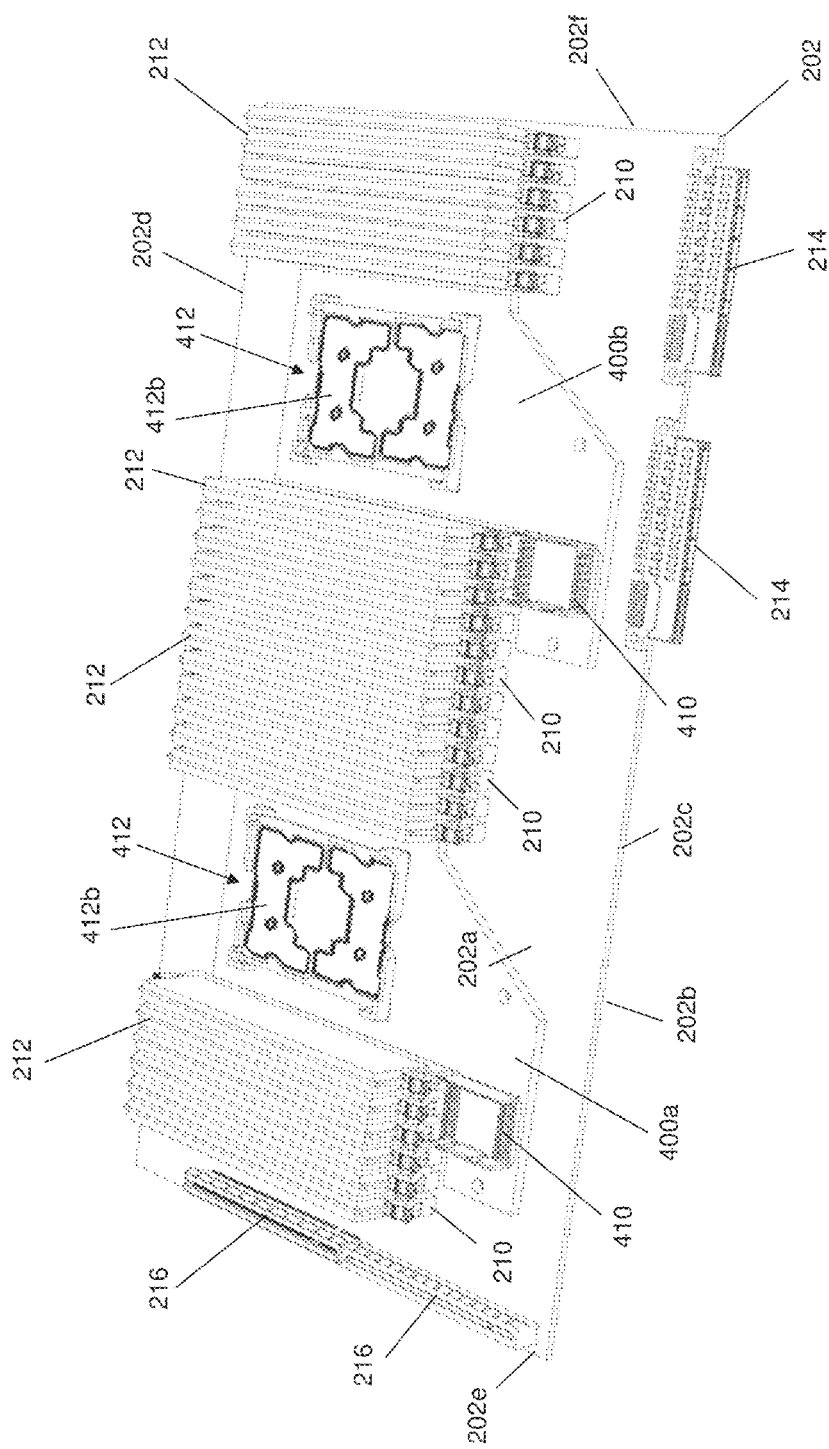
FIG. 7 is a perspective view illustrating an embodiment of a plurality of the adapter boards of FIGS. 4a, 4b, 4c, and 4d coupled to the first board of FIG. 2.

The first adapter board 400a is then moved towards the first board 200 such that the first adapter board 400a engages the primary first processor coupling 204 on the first board 200 (e.g., the processor connector pads 404 or coupling feature on the bottom surface 402b of the first adapter board 400a engages the primary first processor coupling 204 or connector pads on the first board 200) to provide an electrical communication connection between the primary first processor coupling 204 on the first board 200 and the secondary first processor coupling 412 on the first adapter board 400a, as illustrated in FIG. 7. Similarly, the second adapter board 400b is moved towards the first board 200 such that the second adapter board 400b engages the primary second processor coupling 206 on the first board 200 (e.g., the processor connector pads 404 or coupling feature on the bottom surface 402b of the first adapter board 400a engages the primary second processor coupling 206 or connector pads on the first board 200) to provide an electrical communication connection between the primary second processor coupling 206 on the first board 200 and the secondary second processor coupling 412 on the second adapter board 400b, as illustrated in FIG. 7. In an embodiment, processor retention features may be removed from the primary first processor coupling 204 and the primary second processor coupling 206 on the first board 200 prior to engaging the first adapter board 400a and the second adapter board 400b with the primary first processor coupling 204 and the primary second processor coupling 206, respectively. As such, the engagement of the first adapter board 400a with the primary first processor coupling 204 and the second adapter board 400b with the primary second processor coupling 206, respectively, may be an engagement of connector pads (i.e., the processor connector pads 404 on the adapter boards 400 and similar connector pads on the first board 200.) In such embodiments, the processor retention features, heat sink retention features, and/or other components that were removed from the first board 200 may be provided on the adapter boards 400a and 400b to provide the secondary first processor coupling 412 on the first adapter board 400a and the secondary second processor coupling 412 on the second adapter board 400b.

Figure 8:
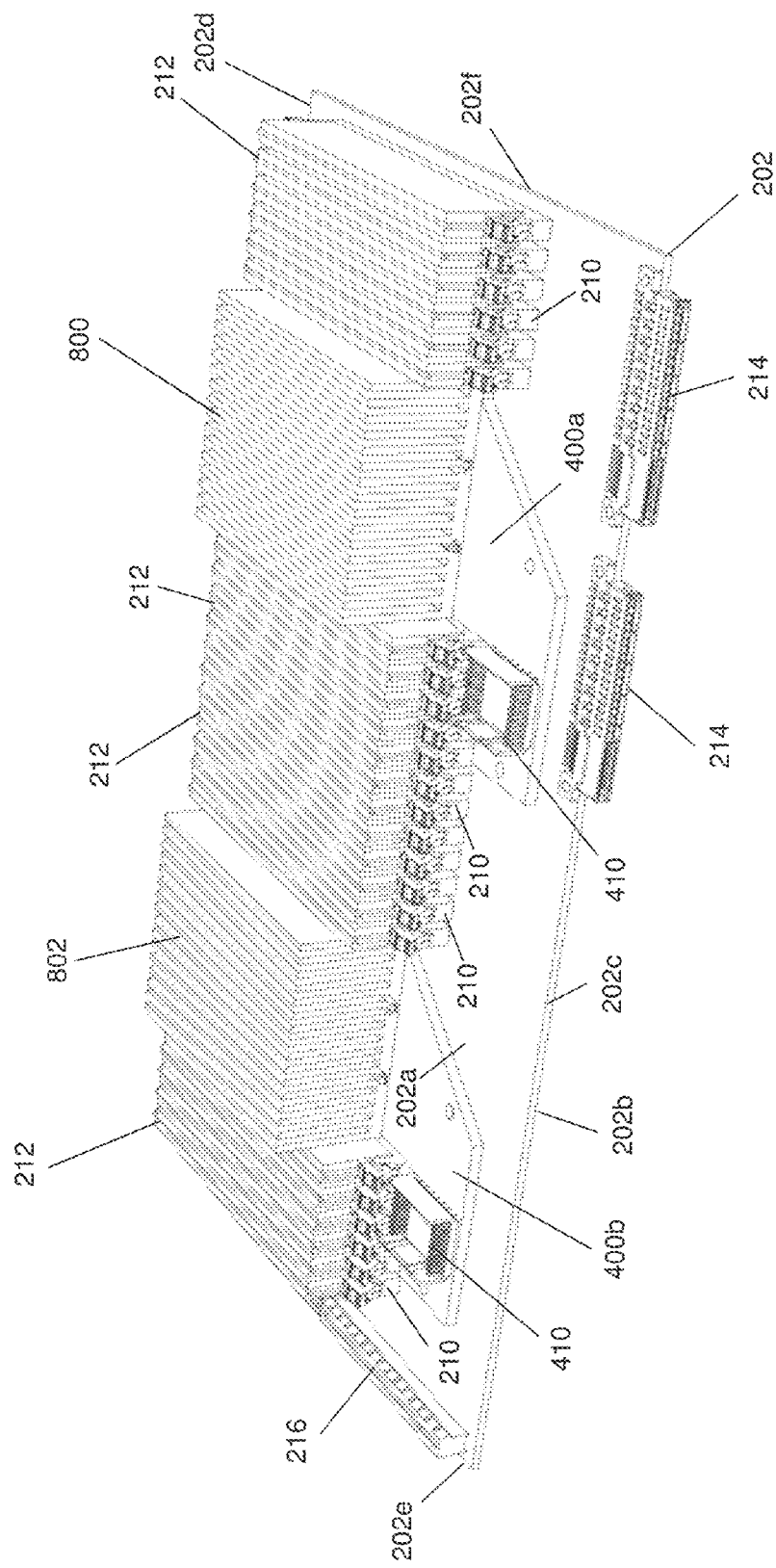
FIG. 8 is a perspective view illustrating an embodiment of processors and heat sinks coupled to the adapter boards and the first board of FIG. 7.

The method 600 then proceeds to block 604 where processors are engaged with the secondary processor couplings on the adapter boards. In an embodiment of block 604, a first processor is positioned adjacent the secondary first processor coupling 412 on the first adapter board 400a such that connections on the first processor are aligned with the secondary first processor coupling 412 on the first adapter board 400a. Similarly, a second processor is positioned adjacent the secondary second processor coupling 412 on the second adapter board 400b such that connections on the second processor are aligned with the secondary second processor coupling 412 on the second adapter board 400b. The first processor is then moved towards the secondary first processor coupling 412 on the first adapter board 400a such that the first processor mates with the secondary first processor coupling 412 on the first adapter board 400a to provide an electrical communication connection between that secondary first processor coupling 412 and the first processor, and a heat sink 800 is mounted to the secondary first processor coupling 412 on the first adapter board 400a using the heat sink coupling features 412c such that the heat sink 800 engages the first processor, as illustrated in FIG. 8. Similarly, the second processor is moved towards secondary second processor coupling 412 on the second adapter board 400b such that the second processor mates with the secondary second processor coupling 412 on the second adapter board 400b to provide an electrical communication connection between that secondary second processor coupling 412 and the second processor, and a heat sink 802 is mounted to the secondary second processor coupling 412 on the second adapter board 400b using the heat sink coupling features 412c such that the heat sink 802 engages the second processor, as illustrated in FIG. 8.

Figure 9A:
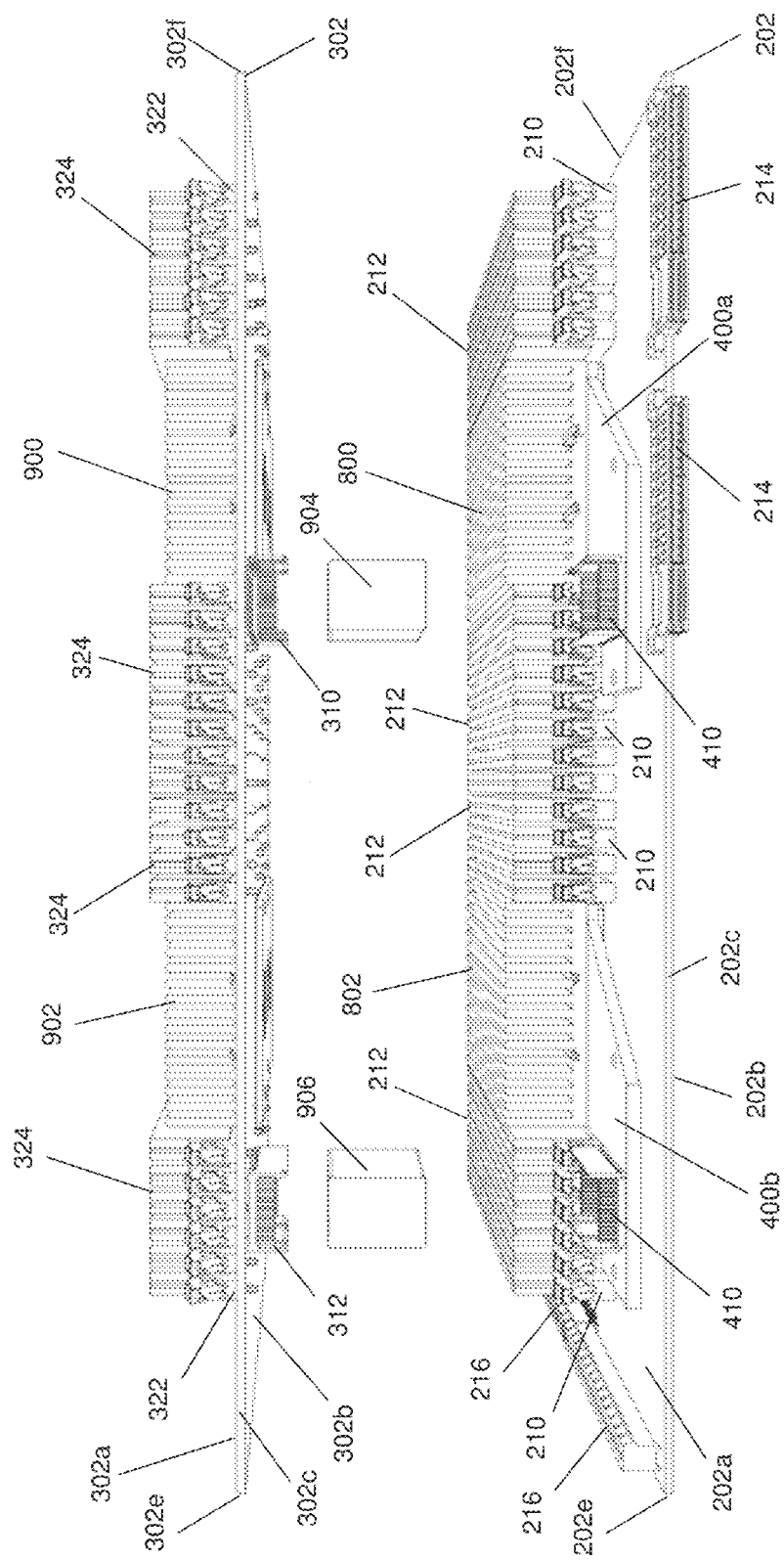
FIG. 9a is a side perspective view illustrating an embodiment of the second board of FIGS. 3a and 3b being coupled to the adapter boards and the first board of FIG. 8.

The method 600 then proceeds to block 606 where a second board is engaged with the adapter boards. Referring now to FIGS. 2, 3, 4a-4d, 9a, and 9b, the second board 300 is illustrated with processors and heat sinks coupled to the third processor coupling 304 and the fourth processor coupling 306, and that process may be performed substantially as discussed above with the first processor and the second processor. Specifically, a third processor is positioned adjacent the third processor coupling 304 on the second board 300 such that connections on the third processor are aligned with the third processor coupling 304 on the second board 300, and a fourth processor is positioned adjacent the fourth processor coupling 306 on the second board 300 such that connections on the fourth processor are aligned with the fourth processor coupling 306 on the second board 300. The third processor is then moved towards the third processor coupling 304 on the second board 300 such that the third processor mates with the third processor coupling 304 on the second board 300 to provide an electrical communication connection between the third processor coupling 412 and the third processor, and a heat sink 900 is mounted to the third processor coupling 304 on the second board 300 using the heat sink coupling features (not illustrated, but similar to the heat sink coupling features 412c on the adapter board 400) such that the heat sink 900 engages the third processor, as illustrated in FIG. 9a.

Similarly, the fourth processor is moved towards the fourth processor coupling 306 on the second board 300 such that the fourth processor mates with the fourth processor coupling 306 on the second board 300 to provide an electrical communication connection between the fourth processor coupling 306 and the fourth processor, and a heat sink 902 is mounted to the fourth processor coupling 306 on the second board 300 using the heat sink coupling features (not illustrated, but similar to the heat sink coupling features 412c on the adapter board 400) such that the heat sink 902 engages the fourth processor, as illustrated in FIG. 9a. While the third processor and fourth processor are illustrated and discussed as being coupled to the second board 300 prior to the coupling of the second board 300 to the first adapter board 400a and the second adapter board 400b, the third processor and fourth processor may be coupled to the second board 300 subsequent to the coupling of the second board 300 to the first adapter board 400a and the second adapter board 400b while remaining within the scope of the present disclosure.

In an embodiment of block 606, the second board 300 is positioned adjacent the first board 200 with the bottom surface 302b of the second board 300 facing the top surface 202a of the first board 200 such that the first adapter board connector 310 on the second board 300 is aligned with the second board connector 410 on the first adapter board 400a, and the second adapter board connector 312 on the second board 300 is aligned with the second board connector 410 on the second adapter board 400b. Before or during the positioning of the second board 300 adjacent the first board 200, a first connector member 904 is positioned between the first adapter board connector 310 on the second board 300 and the second board connector 410 on the first adapter board 400a, and a second connector member 906 is positioned between the second adapter board connector 312 on the second board 300 and the second board connector 410 on the second adapter board 400b.

Figure 9B:
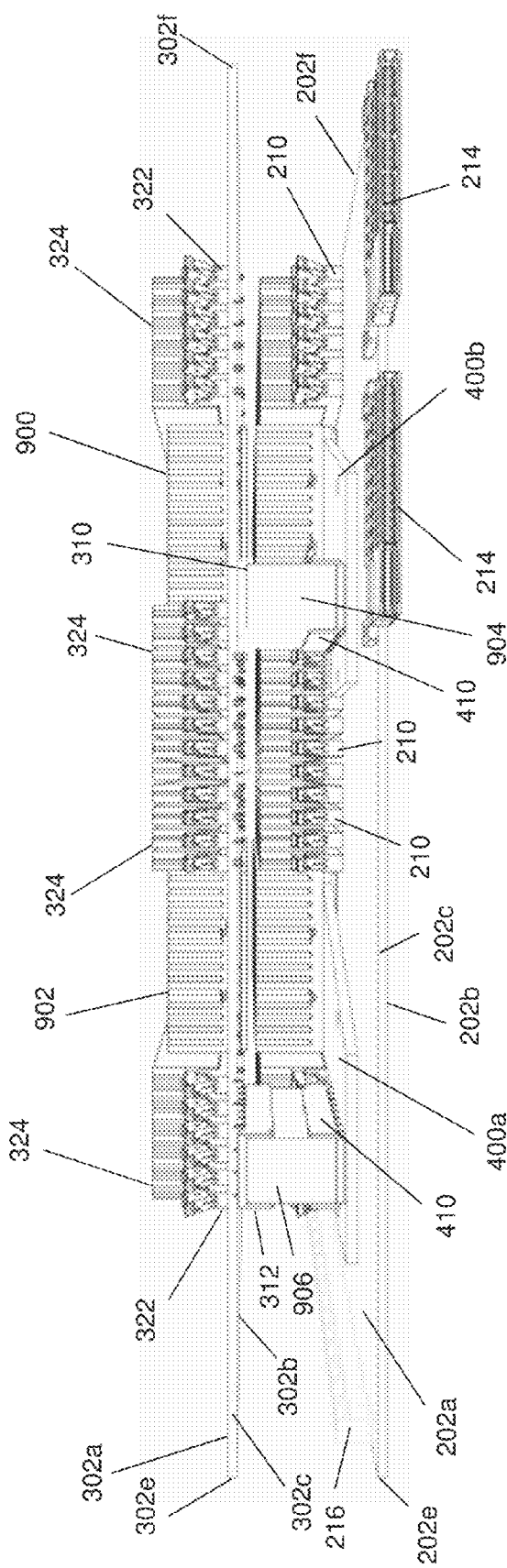
FIG. 9b is a side perspective view illustrating an embodiment of the second board of FIGS. 3a and 3b coupled to the adapter boards and the first board of FIG. 8.

For example, the first connector member 904 may be connected to either of the first adapter board connector 310 on the second board 300 or the second board connector 410 on the first adapter board 400a prior to the positioning of the second board 300 adjacent the first board 200, and the second connector member 906 may be connected to either of the second adapter board connector 312 on the second board 300 or the second board connector 410 on the second adapter board 400b prior to the positioning of the second board 300 adjacent the first board 200. The second board 300 is then moved towards the first board 200 such that the first connector member 904 engages both the first adapter board connector 310 on the second board 300 and the second board connector 410 on the first adapter board 400a, and the second connector member 906 engages both the second adapter board connector 312 on the second board 300 and the second board connector 410 on the second adapter board 400b, as illustrated in FIG. 9b. With the first connector member 904 engaging both the first adapter board connector 310 and the second board connector 410 on the first adapter board 400a and the second connector member 906 engaging both the second adapter board connector 312 and the second board connector 410 on the second adapter board 400b, an electrical communication connection is provided between each of the first adapter board 400a and the second adapter board and the second board 300 to provide a board adapter system. While the first connector member 904 and the second connector member 906 are illustrated and described as high-speed, mezzanine-style stacking connectors, high speed cable connectors and/or other connector systems may be used while remaining within the scope of the present disclosure.

The method 600 then proceeds to block 608 where signals are transmitted using the board adapter system. Referring now to FIGS. 2, 3a, 3b, 4d, 6b, and 9b, at block 608 signals by the first processor, the second processor, the third processor, and the fourth processor may be transmitted between each other and the memory devices 212 and 324. In an embodiment, the first processor that is coupled to the secondary first processor coupling 412 on the first adapter board 400a may send signals to the second processor that is coupled to the secondary second processor coupling 412 on the second adapter board 400b. For example, the first processor may send signals to the second processor through the first subset 414 of the plurality of processor pins 412b (and processor connector pads 404) included in the secondary first processor coupling 412 on the first adapter board 400a, through the primary first processor coupling 204 on the first board 200, through the first/second processor communication bus 208 in the first board 200, through the primary second processor coupling 206 on the first board 200, and through the first subset 414 of the plurality of processor pins 412b (and processor connector pads 404) included in the secondary second processor coupling 412 on the second adapter board 400b.

In an embodiment, the first processor that is coupled to the secondary first processor coupling 412 on the first adapter board 400a may send signals to the third processor that is coupled to the third processor coupling 304 on the second board 300. For example, the first processor may send signals to the third processor through the second subset 416 of the plurality of processor pins 412b (and processor connector pads 404) included in the secondary first processor coupling 412 on the first adapter board 400a, through the first/third processor communication bus 420 on the first adapter board 400a, through the second board connector 410 on the first adapter board 400a, through the first connector member 904, through the first adapter board connector 310 on the second board 300, through the first/third processor communication bus 314 in the second board 200, and through the third processor coupling 304 on the second board 300. Similarly, the first processor that is coupled to the secondary first processor coupling 412 on the first adapter board 400a may send signals to the fourth processor that is coupled to the fourth processor coupling 306 on the second board 300. For example, the first processor may send signals to the fourth processor through the third subset 418 of the plurality of processor pins 412b (and processor connector pads 404) included in the secondary first processor coupling 412 on the first adapter board 400a, through the first/fourth processor communication bus 422 on the first adapter board 400a, through the second board connector 410 on the first adapter board 400a, through the first connector member 904, through the first adapter board connector 310 on the second board 300, through the first/fourth processor communication bus 318 in the second board 200, and through the fourth processor coupling 306 on the second board 300.

In an embodiment, the second processor that is coupled to the secondary second processor coupling 412 on the second adapter board 400b may send signals to the first processor that is coupled to the secondary first processor coupling 412 on the first adapter board 400a. For example, the second processor may send signals to the first processor through the first subset 414 of the plurality of processor pins 412b (and processor connector pads 404) included in the secondary second processor coupling 412 on the second adapter board 400b, through the primary second processor coupling 206 on the first board 200, through the first/second processor communication bus 208 in the first board 200, through the primary first processor coupling 204 on the first board 200, and through the first subset 414 of the plurality of processor pins 412b (and processor connector pads 404) included in the secondary first processor coupling 412 on the first adapter board 400a.

In an embodiment, the second processor that is coupled to the secondary second processor coupling 412 on the second adapter board 400b may send signals to the third processor that is coupled to the third processor coupling 304 on the second board 300. For example, the second processor may send signals to the third processor through the second subset 416 of the plurality of processor pins 412b (and processor connector pads 404) included in the secondary second processor coupling 412 on the second adapter board 400b, through the second/third processor communication bus 420 on the second adapter board 400b, through the second board connector 410 on the second adapter board 400b, through the second connector member 906, through the second adapter board connector 312 on the second board 300, through the second/third processor communication bus 316 in the second board 200, and through the third processor coupling 304 on the second board 300. Similarly, the second processor that is coupled to the secondary second processor coupling 412 on the second adapter board 400b may send signals to the fourth processor that is coupled to the fourth processor coupling 306 on the second board 300. For example, the second processor may send signals to the fourth processor through the third subset 418 of the plurality of processor pins 412b (and processor connector pads 404) included in the secondary second processor coupling 412 on the second adapter board 400b, through the second/fourth processor communication bus 422 on the second adapter board 400b, through the second board connector 410 on the second adapter board 400b, through the second connector member 906, through the second adapter board connector 312 on the second board 300, through the second/fourth processor communication bus 320 in the second board 200, and through the fourth processor coupling 306 on the second board 300.

In an embodiment, the third processor that is coupled to the third processor coupling 304 on the second board 300 may send signals to the fourth processor that is coupled to the fourth processor coupling 306 on the second board 300. For example, the third processor may send signals to the fourth processor through the third processor coupling 304 on the second board 300, through the third-fourth processor communication bus 308 in the second board 300, and through the fourth processor coupling 306 on the second board 300.

In an embodiment, the third processor that is coupled to the third processor coupling 304 on the second board 300 may send signals to the first processor that is coupled to the secondary first processor coupling 412 on the first adapter board 400a. For example, the third processor may send signals to the first processor through the third processor coupling 304, through the first-third processor communication bus 314 in the second board 300, through the first adapter board connector 310 on the second board 300, through the first connector member 904, through the second board connector 410 on the first adapter board 400a, through the first/third processor communication bus 420 on the first adapter board 400a, and through the second subset 416 of the plurality of processor pins 412b (and processor connector pads 404) included in the secondary first processor coupling 412 on the first adapter board 400a. Similarly, the third processor that is coupled to the third processor coupling 304 on the second board 300 may send signals to the second processor that is coupled to the secondary second processor coupling 412 on the second adapter board 400*b*. For example, the third processor may send signals to the second processor through the third processor coupling 304, through the second-third processor communication bus 316 in the second board 300, through the second adapter board connector 312 on the second board 300, through the second connector member 906, through the second board connector 410 on the second adapter board 400*b*, through the second/third processor communication bus 420 on the second adapter board 400*b*, and through the second subset 416 of the plurality of processor pins 412*b* (and processor connector pads 404) included in the secondary second processor coupling 412 on the second adapter board 400*b*.

In an embodiment, the fourth processor that is coupled to the fourth processor coupling 306 on the second board 300 may send signals to the third processor that is coupled to the third processor coupling 304 on the second board 300. For example, the fourth processor may send signals to the third processor through the fourth processor coupling 306 on the second board 300, through the third-fourth processor communication bus 308 in the second board 300, and through the third processor coupling 304 on the second board 300.

In an embodiment, the fourth processor that is coupled to the fourth processor coupling 306 on the second board 300 may send signals to the first processor that is coupled to the secondary first processor coupling 412 on the first adapter board 400*a*. For example, the fourth processor may send signals to the first processor through the fourth processor coupling 306, through the first-fourth processor communication bus 318 in the second board 300, through the first adapter board connector 310 on the second board 300, through the first connector member 904, through the second board connector 410 on the first adapter board 400*a*, through the first/fourth processor communication bus 422 on the first adapter board 400*a*, and through the third subset 418 of the plurality of processor pins 412*b* (and processor connector pads 404) included in the secondary first processor coupling 412 on the first adapter board 400*a*. Similarly, the fourth processor that is coupled to the fourth processor coupling 306 on the second board 300 may send signals to the second processor that is coupled to the secondary second processor coupling 412 on the second adapter board 400*b*. For example, the fourth processor may send signals to the second processor through the fourth processor coupling 304, through the second-fourth processor communication bus 320 in the second board 300, through the second adapter board connector 312 on the second board 300, through the second connector member 906, through the second board connector 410 on the second adapter board 400*b*, through the second/fourth processor communication bus 422 on the second adapter board 400*b*, and through the third subset 418 of the plurality of processor pins 412*b* (and processor connector pads 404) included in the secondary second processor coupling 412 on the second adapter board 400*b*.

Referring now to FIGS. 5*a-c*, in an embodiment, either of the first processor that is coupled to the secondary first processor coupling 412 on the first adapter board 400*a* or the second processor that is coupled to the secondary second processor coupling 412 on the second adapter board 400*b* may send signals to its associated memory devices 212. The sending of such signals is described below for the first processor that is coupled to the secondary first processor coupling 412 on the first adapter board 400*a*, but one of skill in the art in possession of the present disclosure will recognize that that discussion applies equally to the second processor that is coupled to the secondary second processor coupling 412 on the second adapter board 400*b*. The first processor may send signals to, and receive signals from, its associated memory devices using the breakout via system discussed above with reference to FIG. 4*d*. As such, signals sent from the first processor to a memory device are sent through one or more of the plurality of processor pins 412*b* and the plurality of processor connector pads 404 included on the secondary first processor coupling 412 on the first adapter board 400*a*, through respective secondary vias 506 connected to those processor connector pads 404, through respective first connections 504 connected to those secondary vias 506, through respective primary signal vias 502*a* connected to those first connections 504, through respective second connections 508 connected to those primary signal vias 502*a*, through respective secondary vias 510 connected to those second connections 508, and through respective connector pads 404 connected to those secondary vias 510. Those signals may then be provided to the primary first processor coupling 204 on the first board 400*a*, and through processor/memory communication buses to the memory device(s) 212.

It has been found that the signal integrity of signals from a processor, through the adapter board 400, and to memory devices on the first board 200 can meet performance requirements when those signals are routed to the primary signal vias 502*a* surrounded by primary ground vias 502*b* that isolate those signals from each other using the breakout via system described above, which operates to reduce crosstalk relative to a system that just passes those signals directly through the adapter board 400 (i.e., using a via straight though the thickness of the board base 402 between processor connector pads 404 on the top surface 402*a* and the bottom surface 402*b*). For example, FIG. 10 illustrates an eye opening diagram 1000 for a signal that was passed directly through the adapter board 400 without the breakout via system 500, along with an eye opening diagram 1002 for a signal that was passed through the adapter board 400 using the breakout via system 500. Furthermore, in an experimental embodiment, the following data was collected that illustrate the reduction in failures corners in a full design space:

|  | EYE WIDTH MARGIN (ps) | | | EYE HEIGHT MARGIN (mv) | | |
|---|---|---|---|---|---|---|
|  | MIN EYE WIDTH | MAX EYE WIDTH | FAILURE CASES | MIN EYE HEIGHT | MAX EYE HEIGHT | FAILURE CASES |
| MEMORY BREAKOUT SYSTEM | | | | | | |
| DESIGN 1 | 16.8 | 356.4 | 92 | 93.3 | 366.5 | 27 |
| DESIGN 2 | 24.3 | 341.4 | 51 | 105.3 | 352.7 | 8 |
| DESIGN 3 | 24.3 | 359.6 | 69 | 100.8 | 355.2 | 21 |

-continued

| | EYE WIDTH MARGIN (ps) | | | EYE HEIGHT MARGIN (mv) | | |
|---|---|---|---|---|---|---|
| | MIN EYE WIDTH | MAX EYE WIDTH | FAILURE CASES | MIN EYE HEIGHT | MAX EYE HEIGHT | FAILURE CASES |
| | | NO MEMORY BREAKOUT SYSTEM | | | | |
| DESIGN 1 | 11.5 | 373.5 | 139 | 66.5 | 372.2 | 93 |
| DESIGN 2 | 15.8 | 356.4 | 104 | 89.7 | 372.4 | 47 |
| DESIGN 3 | 19.0 | 348.9 | 134 | 49.3 | 313.7 | 70 |

As can be seen above, most of the eye width margin and eye height margin failure cases saw reductions of over 50% from the no-memory breakout system to the memory breakout system. For example, using common design 1, eye width margin failure cases were reduced from 139 with no memory breakout system to 92 with a memory breakout system, and eye height margin failure cases were reduced from 93 with no memory breakout system to 27 with a memory breakout system. Using common design 2, eye width margin failure cases were reduced from 104 with no memory breakout system to 51 with a memory breakout system, and eye height margin failure cases were reduced from 47 with no memory breakout system to 8 with a memory breakout system. Using common design 3, eye width margin failure cases were reduced from 134 with no memory breakout system to 69 with a memory breakout system, and eye height margin failure cases were reduced from 70 with no memory breakout system to 21 with a memory breakout system.

Thus, systems and methods have been described that include an adapter board that that provides for the coupling together of two boards that are configured to couple to multiple processors, while allowing for the communication between all of the processors, and addressing signal integrity issues associated with transmitting signals to memory devices by processors that are coupled to the adapter boards. The systems and methods allow for the manufacture of a board that may be used in different system configurations, and the use of the adapter board to enable at least one of those configurations such that cost and manufacturing efficiencies may be realized. For example, specific embodiments of the present disclosure allow a cost-optimized, two-processor motherboard to be leveraged as part of either a two-processor server or a four-processor server. However, other embodiments with different numbers of processors (e.g., six processor, eight processors, etc.) and boards (e.g., 3 boards, 4 boards, etc.) are envisioned as falling within the scope of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board, comprising:
 a board base including a first surface and a second surface that is located opposite the board base from the first surface;
 a plurality of first coupling pads located on the first surface of the board base;
 a plurality of second coupling pads that are located on the second surface of the board base such that each respective second coupling pad of the plurality of second coupling pads is located opposite the board base from a respective first coupling pad of the plurality of first coupling pads, wherein the plurality of first coupling pads and the plurality of second coupling pads define a coupling pad footprint; and
 a breakout via system included in the board base, wherein the breakout via system includes:
  a plurality of primary signal vias that are located in the board base and outside of the coupling pad footprint;
  a plurality of primary ground vias that are located in the board base and outside of the coupling pad footprint, wherein the plurality of primary ground vias are positioned in the board base in relation to the plurality of primary signal vias such that the plurality of primary ground vias isolate signals provided through each of the plurality of primary signal vias from each other;
  a plurality of first primary signal via connections that extend between the primary signal vias and the plurality of first coupling pads; and
  a plurality of second primary signal via connections that extend between the primary signal vias and the plurality of second coupling pads,
  wherein each respective second coupling pad of the plurality of second coupling pads is connected to the respective first coupling pad of the plurality of first coupling pads through a respective second primary signal via connection of the plurality of second primary signal via connections, a respective primary signal via of the plurality of primary signal vias, and a respective first primary signal via connection of the plurality of first primary signal via connections.

2. The circuit board of claim 1, wherein the breakout via system includes:
 a plurality of first primary ground via connections that extend between the plurality of primary ground vias and the plurality of first coupling pads; and
 a plurality of second primary ground via connections that extend between the plurality of primary ground vias and the plurality of second coupling pads.

3. The circuit board of claim 1, wherein the plurality of first primary signal via connections include:
 a first plurality of secondary vias that are smaller than the plurality of primary signal vias and that are coupled to the plurality of first coupling pads, wherein the plurality of second primary signal via connections include a second plurality of secondary vias that are smaller than the plurality of primary signal vias and that are coupled to the plurality of second coupling pads.

4. The circuit board of claim 3, wherein the plurality of primary signal vias are more than 100 millimeters in length, and the first plurality of secondary vias and the second plurality of secondary vias are less than 10 millimeters in length.

5. The circuit board of claim 1, wherein the plurality of first coupling pads are configured to couple to a processor, and wherein the plurality of primary signal vias, the plurality of first primary signal via connections, and the plurality of second primary signal via connections are configured to transmit memory signals received at the plurality of first coupling pads from the processor to the plurality of second coupling pads.

6. The circuit board of claim 1, wherein the board base is sized such that the breakout via system is located between a perimeter of the coupling pad footprint and an edge of the board base.

7. The circuit board of claim 1, wherein subsets of the plurality of first primary signal via connections and subsets of the plurality of second primary signal via connections are length matched and configured to transmit differential pair signals.

8. An information handling system (IHS), comprising:
- a first board including a first surface and a second surface that is located opposite the first board from the first surface;
- a plurality of first coupling pads located on the first surface of the first board;
- a plurality of second coupling pads that are located on the second surface of the first board such that each respective second coupling pad of the plurality of second coupling pads is located opposite the first board from a respective first coupling pad of the plurality of first coupling pads;
- a processor mounted to the plurality of first coupling pads located on the first surface of the first board, wherein the mounting of the processor to the first surface defines a processor mounting footprint;
- a second board engaging the plurality of second coupling pads located on the second surface of the first board; and
- a breakout via system included in the first board, wherein the breakout via system includes:
  - a plurality of primary signal vias that are located in the first board and outside of the processor mounting footprint;
  - a plurality of primary ground vias that are located in the first board and outside of the processor mounting footprint, wherein the plurality of primary ground vias are positioned in the first board in relation to the plurality of primary signal vias such that the plurality of primary ground vias isolate signals provided through each of the plurality of primary signal vias from each other;
  - a plurality of first primary signal via connections that extend from the primary signal vias and that couple to the processor through the plurality of first coupling pads; and
  - a plurality of second primary signal via connections that extend from the primary signal vias and that couple to the second board through the plurality of second coupling pads,
  - wherein each respective second coupling pad of the plurality of second coupling pads is connected to the respective first coupling pad of the plurality of first coupling pads through a respective second primary signal via connection of the plurality of second primary signal via connections, a respective primary signal via of the plurality of primary signal vias, and a respective first primary signal via connection of the plurality of first primary signal via connections.

9. The IHS of claim 8, wherein the breakout via system includes
- a plurality of first primary ground via connections that extend from the plurality of primary ground vias and that couple to the processor; and
- a plurality of second primary ground via connections that extend from the plurality of primary ground vias and that couple to the second board.

10. The IHS of claim 8, wherein the plurality of first primary signal via connections include:
- a first plurality of secondary vias that are smaller than the plurality of primary signal vias and that are coupled to the processor, wherein the plurality of second primary signal via connections include a second plurality of secondary vias that are smaller than the plurality of primary signal vias and that are coupled to the second board.

11. The IHS of claim 10, wherein the plurality of primary signal vias are more than 100 millimeters in length, and the first plurality of secondary vias and the second plurality of secondary vias are less than 10 millimeters in length.

12. The IHS of claim 8, wherein the plurality of primary signal vias, the plurality of first primary signal via connections, and the plurality of second primary signal via connections are configured to transmit memory signals received from the processor to the second board.

13. The IHS of claim 8, wherein subsets of the plurality of first primary signal via connections and subsets of the plurality of second primary signal via connections are length matched and configured to transmit differential pair signals.

14. A method for transmitting a signal, comprising:
- mounting a processor to a plurality of first coupling pads on a first surface of a first board to define a processor mounting footprint;
- engaging a plurality of second coupling pads on a second surface of the first board with a second board, wherein the second surface is located opposite the first board from the first surface and each respective second coupling pad of the plurality of second coupling pads is located opposite the first board from a respective first coupling pad of the plurality of first coupling pads; and
- transmitting signals from the processor to the second board using a breakout via system that is included in the first board, wherein the transmitting includes:
  - transmitting the signals from the processor through a plurality of first primary signal via connections included in the first board and to a plurality of primary signal vias that are located in the first board and outside of the processor mounting footprint, through the plurality of primary signal vias, through a plurality of second primary signal via connections that extend from the primary signal vias and that are coupled to the second board, and to the second board,
  - wherein each respective second coupling pad of the plurality of second coupling pads is connected to the respective first coupling pad of the plurality of first coupling pads through a respective second primary signal via connection of the plurality of second primary signal via connections, a respective primary signal via of the plurality of primary signal vias, and a respective first primary signal via connection of the plurality of first primary signal via connections; and
  - isolating the signals transmitted through each of the plurality of primary signal vias from each other using a plurality of primary ground vias that are located in the first board outside of the processor mounting footprint, wherein the plurality of primary ground vias are positioned in the first board in relation to the plurality of primary signal vias to provide the isolation.

15. The method of claim 14, wherein the transmitting includes:

transmitting the signals from the processor through a plurality of first primary ground via connections included in the first board and to the plurality of primary ground vias, through the plurality of primary ground vias, through a plurality of second primary ground via connections that extend from the plurality of primary ground vias and that are coupled to the second board, and to the second board.

16. The method of claim 14, wherein the plurality of first primary signal via connections include a first plurality of secondary vias that are smaller than the plurality of primary signal vias and that are coupled to the processor, and wherein the plurality of second primary signal via connections include a second plurality of secondary vias that are smaller than the plurality of primary signal vias and that are coupled to the second board.

17. The method of claim 16, wherein the plurality of primary signal vias are more than 100 millimeters in length, and the first plurality of secondary vias and the second plurality of secondary vias are less than 10 millimeters in length.

18. The method of claim 14, wherein the second board includes at least one memory device, and the signals include memory signals.

19. The method of claim 14, wherein the first board is sized such that the breakout via system is located between a perimeter of the processor mounting footprint and an edge of the first board.

20. The method of claim 14, wherein subsets of the plurality of first primary signal via connections and subsets of the plurality of second primary signal via connections are length matched and transmit the signal that includes a differential pair signal.

\* \* \* \* \*